United States Patent
Yamazaki

(10) Patent No.: US 8,617,920 B2
(45) Date of Patent: Dec. 31, 2013

(54) SEMICONDUCTOR DEVICE AND MANUFACTURING METHOD THEREOF

(75) Inventor: Shunpei Yamazaki, Tokyo (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 300 days.

(21) Appl. No.: 13/022,865

(22) Filed: Feb. 8, 2011

(65) Prior Publication Data

US 2011/0198594 A1 Aug. 18, 2011

(30) Foreign Application Priority Data

Feb. 12, 2010 (JP) .................................. 2010-028598

(51) Int. Cl.
*H01L 21/34* (2006.01)
*H01L 29/786* (2006.01)

(52) U.S. Cl.
USPC .. 438/104; 257/43; 257/E21.46; 257/E29.296

(58) Field of Classification Search
USPC ............... 257/43, E21.46, E21.477, E29.296; 438/104
See application file for complete search history.

(56) References Cited

U.S. PATENT DOCUMENTS

| | | | |
|---|---|---|---|
| 5,731,856 A | 3/1998 | Kim et al. |
| 5,744,864 A | 4/1998 | Cillessen et al. |
| 6,294,274 B1 | 9/2001 | Kawazoe et al. |
| 6,563,174 B2 | 5/2003 | Kawasaki et al. |
| 6,727,522 B1 | 4/2004 | Kawasaki et al. |
| 7,049,190 B2 | 5/2006 | Takeda et al. |
| 7,061,014 B2 | 6/2006 | Hosono et al. |
| 7,064,346 B2 | 6/2006 | Kawasaki et al. |
| 7,105,868 B2 | 9/2006 | Nause et al. |
| 7,211,825 B2 | 5/2007 | Shih et al. |
| 7,282,782 B2 | 10/2007 | Hoffman et al. |
| 7,297,977 B2 | 11/2007 | Hoffman et al. |
| 7,323,356 B2 | 1/2008 | Hosono et al. |
| 7,385,224 B2 | 6/2008 | Ishii et al. |
| 7,402,506 B2 | 7/2008 | Levy et al. |

(Continued)

FOREIGN PATENT DOCUMENTS

| | | |
|---|---|---|
| EP | 1 737 044 A1 | 12/2006 |
| EP | 2 226 847 A2 | 9/2010 |

(Continued)

OTHER PUBLICATIONS

Asakuma, N. et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

(Continued)

*Primary Examiner* — Julio J Maldonado
*Assistant Examiner* — Daniel Shook
(74) *Attorney, Agent, or Firm* — Fish & Richardson P.C.

(57) ABSTRACT

It is an object to provide a semiconductor device having excellent electric characteristics or high reliability, or a manufacturing method thereof. A semiconductor device including a gate electrode, an oxide semiconductor layer overlapping with the gate electrode, a source electrode and a drain electrode in contact with the oxide semiconductor layer, and a gate insulating layer provided between the gate electrode and the oxide semiconductor layer is provided. The oxide semiconductor layer is formed by a facing target sputtering method. The carrier concentration of the oxide semiconductor is less than $1 \times 10^{12}/cm^3$.

14 Claims, 9 Drawing Sheets

(56) References Cited

U.S. PATENT DOCUMENTS

| | | |
|---|---|---|
| 7,411,209 B2 | 8/2008 | Endo et al. |
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager, III et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara et al. |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0090365 A1 | 4/2007 | Hayashi et al. |
| 2007/0108446 A1 | 5/2007 | Akimoto |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2008/0308796 A1 | 12/2008 | Akimoto et al. |
| 2008/0308797 A1 | 12/2008 | Akimoto et al. |
| 2008/0308805 A1 | 12/2008 | Akimoto et al. |
| 2008/0308806 A1 | 12/2008 | Akimoto et al. |
| 2009/0008639 A1 | 1/2009 | Akimoto et al. |
| 2009/0068773 A1 | 3/2009 | Lai et al. |
| 2009/0073325 A1 | 3/2009 | Kuwabara et al. |
| 2009/0090914 A1 | 4/2009 | Yano et al. |
| 2009/0114910 A1 | 5/2009 | Chang |
| 2009/0134399 A1 | 5/2009 | Sakakura et al. |
| 2009/0152506 A1 | 6/2009 | Umeda et al. |
| 2009/0152541 A1 | 6/2009 | Maekawa et al. |
| 2009/0239335 A1 | 9/2009 | Akimoto et al. |
| 2009/0278122 A1 | 11/2009 | Hosono et al. |
| 2009/0280600 A1 | 11/2009 | Hosono et al. |
| 2009/0305461 A1 | 12/2009 | Akimoto et al. |
| 2010/0065844 A1 | 3/2010 | Tokunaga |
| 2010/0092800 A1 | 4/2010 | Itagaki et al. |
| 2010/0109002 A1 | 5/2010 | Itagaki et al. |
| 2010/0136743 A1 | 6/2010 | Akimoto et al. |
| 2010/0163860 A1* | 7/2010 | Yano et al. ............ 257/43 |
| 2010/0283049 A1 | 11/2010 | Sato et al. |
| 2010/0301329 A1* | 12/2010 | Asano et al. ............ 257/43 |

FOREIGN PATENT DOCUMENTS

| | | | |
|---|---|---|---|
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 A | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2006-005115 A | 1/2006 | |
| JP | 200605115 A * | 1/2006 | ............ H01L 21/316 |
| JP | 200605515 A * | 1/2006 | ............ H01L 21/316 |
| JP | 2007-096055 A | 4/2007 | |
| JP | 2007-123861 A | 5/2007 | |
| WO | 2004/114391 A1 | 12/2004 | |

OTHER PUBLICATIONS

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using Castep," Zeitschrift fur Kristallographie, 2005, vol. 220, pp. 567-570.

Coates. D et al., Optical Studies of the Amorphous Liquid-Cholesteric Liquid Crystal Transition: The "Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZnO Thin-Film Transistors Produced At Room Temperature," Appl. Phys. Lett. (Applied Physics Letters), Sep. 27, 2004, vol. 85, No. 13, pp. 2541-2543.

(56) References Cited

OTHER PUBLICATIONS

Fung, T et al., "2-D Numerical Simulation of High Performance Amorphous In—Ga—Zn—O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In—Ga—Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In—Ga—Zn-Oxide TFT," AM-FPD '09 Digest of Technical Papers, Jul. 1, 2009, pp. 41-44.

Hayashi, R et al., "42.1: Invited Paper: Improved Amorphous In—Ga—Zn—O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04. : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5∆) Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 As a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases," Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "Spinel,YBFE2O4, and YB2FE3O7 Types of Structures for Compounds in the IN2O3 and SC2O3—A2O3—BO Systems [A; Fe, Ga, or Al; B: Mg, Mn, Fe, Ni, Cu,or Zn] At Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m= 3, 4, and 5), InGaO3(ZnO)3, and Ga2O3(ZnO)m (m= 7, 8, 9, and 16) in the In2O3—ZnGa2O4—ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World'S Largest (15-Inch) XGA AMLCD Panel Using Igzo Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al. ' "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "Suftla Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3—Ga2ZnO4—ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics) , 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters) , Sep. 13, 2004, vol. 85, No. 11, pp. 1993-1995.

Nowatari, H et al., "60.0: Intermediate Connector with Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors with Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 In. QVGA AMOLED Display using In—Ga—Zn-Oxide TFTS with a Novel Passivation Layer," SID

(56) References Cited

OTHER PUBLICATIONS

Digest '09 : SID International Symposium Digest of Technical Papers, May 31, 2009, pp. 284-287.

Ohara, H et al., "Amorphous In—Ga—Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review. B), Jan. 15, 2000, vol. 61, No. 3, pp. 1811-1816.

Osada, T et al., "15.2: Development of Driver-Integrated Panel using Amorphous In—Ga—Zn-Oxide TFT," SID Digest '09 : SID International Symposium Digest of Technical Papers, May 31, 2009, pp. 184-187.

Osada, T et al., "Development of Driver-Integrated Panel Using Amorphous In—Ga—Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci, Technol. B (Journal of Vacuum Science & Technology B), Mar. 1, 2003, vol. 21, No. 2, pp. 800-803.

Park. J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park. J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park. S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Developement of 4.0-In. AMOLED Display with Driver Circuit using Amorphous In—Ga—Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3—In2O3—ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda, K et al., "Ultra Low Power Consumption Technologies for Mobile TFT-LCDs," IDW '02 : Proceedings of the 9th International Display Workshops, Dec. 4, 2002, pp. 295-298.

Ueno, K et al., "Field-Effect Transistor on SrTiO3 with Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No. 5, pp. 1012-1015.

\* cited by examiner

SEMICONDUCTOR DEVICE AND MANUFACTURING METHOD THEREOF

BACKGROUND OF THE INVENTION

1. Field of the Invention

The technical field of the present invention relates to a semiconductor device and a manufacturing method of the semiconductor device. Here, semiconductor devices refer to general elements and devices that function by utilizing semiconductor characteristics.

2. Description of the Related Art

A technique in which a semiconductor device such as a transistor is manufactured using an oxide semiconductor as a semiconductor material and the semiconductor device is applied to a semiconductor integrated circuit and an electronic device has attracted attention. For example, Patent Document 1 and Patent Document 2 disclose a technique in which a transistor is manufactured using zinc oxide or an In—Ga—Zn—O-based oxide semiconductor as a semiconductor material and such a transistor is used as a switching element or the like of an image display device.

A transistor in which a channel formation region (also referred to as a channel region) is provided in an oxide semiconductor can have higher mobility than a transistor in which amorphous silicon is used. Further, an oxide semiconductor film can be formed by a sputtering method or the like at a relatively low temperature. Its manufacturing process is easier than that of a transistor manufactured using polycrystalline silicon. For example, Patent Document 3 discloses a thin film transistor in which a zinc oxide thin film formed by a sputtering method in which a pair of targets provided to face each other is used for a channel formation region.

Reference

[Patent Document 1] Japanese Published Patent Application No. 2007-123861
[Patent Document 2] Japanese Published Patent Application No. 2007-096055
[Patent Document 3] Japanese Published Patent Application No. 2006-005115

SUMMARY OF THE INVENTION

However, a semiconductor element including an oxide semiconductor has not had excellent characteristics yet. For example, electric characteristics such as a controlled threshold voltage, high operation speed, or sufficient reliability is required for a transistor including an oxide semiconductor layer.

In view of the above, it is an object of one embodiment of the present invention to provide a semiconductor device having excellent electric characteristics or a manufacturing method thereof. Alternatively, it is an object to provide a semiconductor device having high reliability or a manufacturing method thereof.

In a manufacturing process of a transistor, when plasma damage is caused at the interface between a gate insulating layer and an oxide semiconductor layer, a defect (an interface trap) is caused at the interface between the gate insulating layer and the oxide semiconductor layer. Further, when the plasma damage is caused in one or both of the gate insulating layer and the oxide semiconductor layer, a defect (an in-film trap) is caused. These defects cause a threshold voltage shift of the transistor.

Furthermore, the density of carriers (also referred to as the concentration of carriers) in an oxide semiconductor film has influence on the threshold voltage of the transistor including the oxide semiconductor. The carriers in the oxide semiconductor film are generated due to impurities contained in the oxide semiconductor film. For example, impurities such as a compound containing a hydrogen atom such as $H_2O$, a compound containing a carbon atom, a hydrogen atom, or a carbon atom contained in the deposited oxide semiconductor film increase the density of carriers in an oxide semiconductor film.

In the transistor manufactured using the oxide semiconductor film containing impurities such as a compound containing a hydrogen atom such as $H_2O$ or a hydrogen atom, it is difficult to control degradation over time such as the threshold voltage shift.

To achieve the above object, in the manufacturing process, plasma damage to at least one of the gate insulating layer, the oxide semiconductor layer, and the interface therebetween is suppressed. Further, impurities that influence on the density of carriers in the oxide semiconductor film, for example, a compound containing a hydrogen atom such as $H_2O$ or a hydrogen atom, may be removed.

Specifically, one embodiment of the present invention is a semiconductor device including a gate electrode, an oxide semiconductor layer overlapping with the gate electrode, a source electrode and a drain electrode in contact with the oxide semiconductor layer, and a gate insulating layer provided between the gate electrode and the oxide semiconductor layer, in which the oxide semiconductor layer is deposited by a facing target sputtering method, and the concentration of carriers in the oxide semiconductor layer is lower than $1\times10^{12}/cm^3$.

Another embodiment of the present invention is a semiconductor device including a gate electrode, an oxide semiconductor layer overlapping with the gate electrode, a source electrode and a drain electrode in contact with the oxide semiconductor layer, and a gate insulating layer provided between the gate electrode and the oxide semiconductor layer, in which the concentration of carriers in the oxide semiconductor layer is lower than $1\times10^{12}/cm^3$, and the gate insulating layer is deposited by a facing target sputtering method.

In the above semiconductor device, the oxide semiconductor layer is preferably deposited by the facing target sputtering method.

Alternatively, the above semiconductor device further includes an insulating layer in contact with at least a part of the oxide semiconductor layer, and the insulating layer is preferably deposited by the facing target sputtering method.

Another embodiment of the present invention is a manufacturing method of a semiconductor device including the steps of: forming a gate electrode over a substrate; forming a gate insulating layer over the gate electrode; forming an oxide semiconductor layer over the gate insulating layer; and forming a source electrode and a drain electrode electrically connected to the oxide semiconductor layer, in which the oxide semiconductor layer is deposited by a sputtering method in which a pair of targets provided to face each other, after the oxide semiconductor layer is formed, the concentration of hydrogen in the oxide semiconductor layer is reduced by first heat treatment, and oxygen is supplied to the oxide semiconductor layer by second heat treatment.

Another embodiment of the present invention is a manufacturing method of a semiconductor device including the steps of: forming an oxide semiconductor layer over a substrate; forming a source electrode and a drain electrode electrically connected to the oxide semiconductor layer; forming a gate insulating layer in contact with at least a channel formation region of the oxide semiconductor layer; and forming a gate electrode over the gate insulating layer, in which the oxide semiconductor layer is deposited by a sputtering method in which a pair of targets provided to face each other, after the oxide semiconductor layer is formed, the concentration of hydrogen in the oxide semiconductor layer is reduced by first heat treatment, and oxygen is supplied to the oxide semiconductor layer by second heat treatment.

Note that in the above manufacturing method of a semiconductor device, the gate insulating film is preferably deposited by a sputtering method in which a pair of targets provided to face each other.

Alternatively, in the above manufacturing method of a semiconductor device, an insulating layer is preferably deposited to be in contact with the oxide semiconductor layer by a sputtering method in which a pair of targets provided to face each other.

In this specification and the like, the terms "over" and "below" do not necessarily mean "directly on" and "directly below", respectively, in the description of a physical relationship between components. For example, the expression "a gate electrode over a gate insulating layer" can mean the case where there is an additional component between the gate insulating layer and the gate electrode.

In this specification and the like, the term such as "electrode" or "wiring" does not limit a function of a component. For example, an "electrode" is sometimes used as part of a "wiring", and vice versa. Furthermore, the term "electrode" or "wiring" can include the case where a plurality of "electrodes" or "wirings" are formed in an integrated manner.

Functions of a "source" and a "drain" are sometimes switched when a transistor of opposite polarity is used or when the direction of current flow is changed in circuit operation, for example. Therefore, the terms "source" and "drain" can be used to denote the drain and the source, respectively, in this specification.

Note that in this specification and the like, the term "electrically connected" includes the case where components are connected through an "object having any electric function". There is no particular limitation on an "object having any electric function" as long as electric signals can be transmitted and received between components that are connected through the object. Examples of the "object having any electric function" are a switching element such as a transistor, a resistor, an inductor, a capacitor, and an element with a variety of functions as well as an electrode and a wiring.

According to one embodiment of the disclosed invention, one or both of the following effects can be obtained.

According to one embodiment of the present invention, a semiconductor device having excellent electric characteristics or a manufacturing method thereof can be provided.

According to one embodiment of the present invention, a semiconductor device having high reliability or a manufacturing method thereof can be provided.

DETAILED DESCRIPTION OF THE INVENTION

Figure 1A:
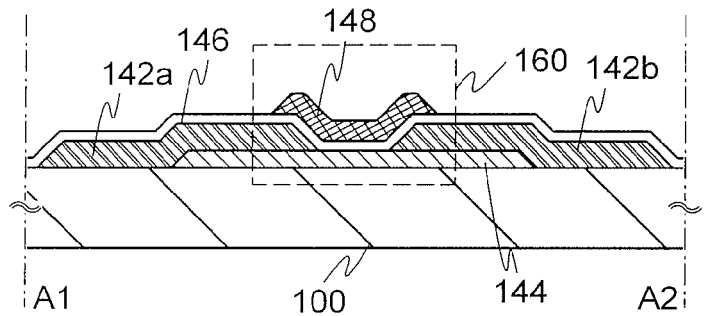
FIGS. 1A to 1D are cross-sectional views of semiconductor devices.

Hereinafter, examples of embodiments of the present invention will be described with reference to the drawings. Note that the present invention is not limited to the following description and it will be readily appreciated by those skilled in the art that modes and details can be modified in various ways without departing from the spirit and the scope of the present invention. Therefore, the invention should not be construed as being limited to the description in the following embodiments.

Note that the position, the size, the range, or the like of each structure illustrated in drawings and the like is not accurately represented in some cases for easy understanding. Therefore, the disclosed invention is not necessarily limited to the position, size, range, or the like as disclosed in the drawings and the like.

In this specification and the like, ordinal numbers such as "first", "second", and "third" are used in order to avoid confusion among components, and the terms do not mean limitation of the number of components.

[Embodiment 1]

In this embodiment, an example of a structure of a semiconductor device and a manufacturing process thereof according to one embodiment of the disclosed invention will be described with reference to FIGS. 1A to 1D, FIG. 2, FIGS. 3A to 3B, and FIGS. 4A to 4C.

<Example of Structure of Semiconductor Device>

In FIGS. 1A to 1D, cross-sectional structures of transistors are illustrated as examples of semiconductor devices.

A transistor 160 illustrated in FIG. 1A is an example of a top-gate transistor. The transistor 160 includes, over a substrate 100, an oxide semiconductor layer 144, a source electrode 142a and a drain electrode 142b in contact with the oxide semiconductor layer 144, a gate insulating layer 146 covering at least a channel formation region of the oxide semiconductor layer 144, the source electrode 142a, and the drain electrode 142b, and a gate electrode 148 provided over the gate insulating layer 146 and overlapping with the channel formation region of the oxide semiconductor layer 144.

Figure 1B:
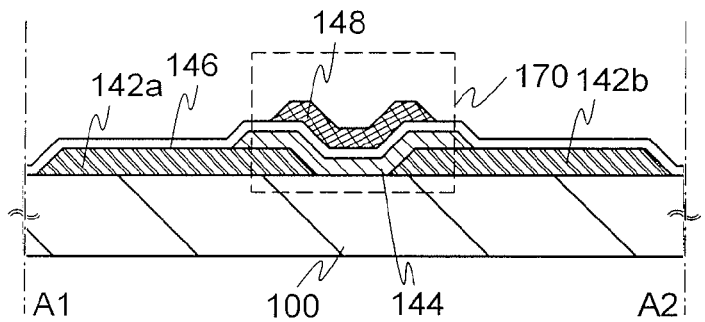

A transistor 170 illustrated in FIG. 1B is also an example of a top-gate transistor. One of the difference between the transistor 160 illustrated in FIG. 1A and the transistor 170 is the stacking order of the source and drain electrodes 142a and 142b and the oxide semiconductor layer 144. That is, the transistor 170 illustrated in FIG. 1B includes, over the substrate 100, the source electrode 142a and the drain electrode 142b, the oxide semiconductor layer 144 in contact with at least one end surface of the source electrode 142a and one end surface of the drain electrode 142b, the gate insulating layer 146 provided over the oxide semiconductor layer 144, and the gate electrode 148 provided over the gate insulating layer 146 and overlapping with the channel formation region of the oxide semiconductor layer 144.

Figure 1C:
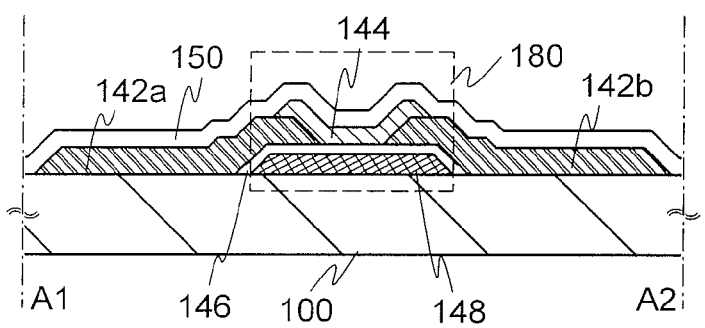

A transistor 180 illustrated in FIG. 1C is an example of a bottom-gate transistor. The transistor 180 includes, over the substrate 100, the gate electrode 148, the gate insulating layer 146 covering the gate electrode 148, the source electrode 142a and the drain electrode 142b provided over the gate insulating layer 146, the oxide semiconductor layer 144 in contact with at least one end surface of the source electrode 142a and one end surface of the drain electrode 142b, and an insulating layer 150 provided over the oxide semiconductor layer 144. Note that the insulating layer 150 is not necessarily provided.

Figure 1D:
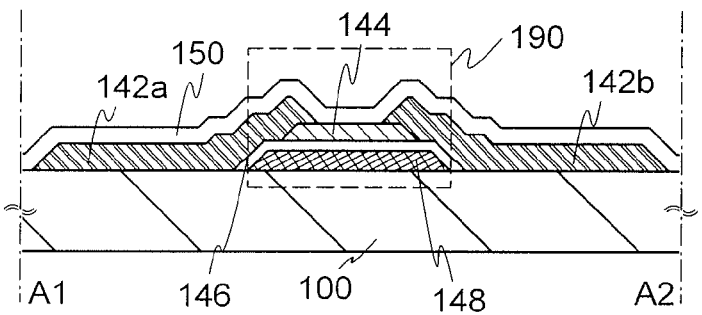

A transistor 190 illustrated in FIG. 1D is also an example of a bottom-gate transistor. One of the difference between the transistor 190 and the transistor 180 illustrated in FIG. 1C is the stacking order of the source and drain electrodes 142a and 142b and the oxide semiconductor layer 144. That is, the transistor 190 illustrated in FIG. 1D includes, over the substrate 100, the gate electrode 148, the gate insulating layer 146 covering the gate electrode 148, the oxide semiconductor layer 144 provided over the gate insulating layer 146, the source electrode 142a and the drain electrode 142b in contact with the oxide semiconductor layer 144, and the insulating layer 150 covering at least the channel formation region of the oxide semiconductor layer 144, the source electrode 142a, and the drain electrode 142b. Note that the insulating layer 150 is not necessarily provided.

The oxide semiconductor layer 144 included in each transistor illustrated in FIGS. 1A to 1D is an oxide semiconductor layer which is highly purified by sufficiently removing impurities such as hydrogen therefrom or by sufficiently supplying oxygen thereto. Specifically, for example, the concentration of hydrogen in the oxide semiconductor layer 144 is lower than or equal to $5 \times 10^{19}$ atoms/cm$^3$, preferably lower than or equal to $5 \times 10^{18}$ atoms/cm$^3$, further preferably lower than or equal to $5 \times 10^{17}$ atoms/cm$^3$. Note that the concentration of hydrogen in the oxide semiconductor layer 144 is measured by secondary ion mass spectroscopy (SIMS). Thus, in the oxide semiconductor layer 144 in which the concentration of hydrogen is sufficiently reduced so that the oxide semiconductor layer is highly purified and defect levels in the energy gap due to oxygen deficiency are reduced by sufficient supply of oxygen, the carrier concentration due to hydrogen or oxygen deficiency is lower than $1 \times 10^{12}$/cm$^3$, preferably lower than $1 \times 10^{11}$/cm$^3$, further preferably lower than $1.45 \times 10^{10}$/cm$^3$. In the transistor including the oxide semiconductor layer 144, the off-state current can be sufficiently reduced. For example, in the transistor including the oxide semiconductor layer 144 having a thickness of 30 nm and a channel length of 2 μm, the off-state current (a gate bias: −3 V) per unit channel width of 1 μm at room temperature (25° C.) is lower than or equal to 100 zA (zeptoampere), preferably lower than or equal to 10 zA. Therefore, a transistor with significantly excellent off-state current characteristics can be obtained with the use of such an oxide semiconductor that is highly purified (hereinafter, in this specification, such as an oxide semiconductor that is also referred to as an i-type (intrinsic) or substantially i-type oxide semiconductor).

Figure 2:
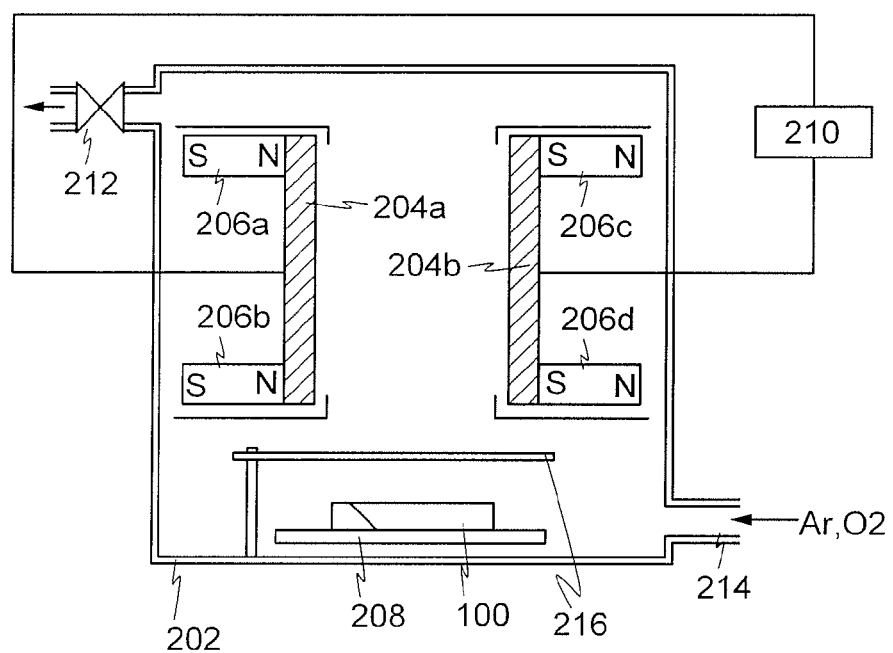
FIG. 2 is a cross-sectional view of a deposition apparatus.

Further, one of the oxide semiconductor layer 144 and the gate insulating layer 146, preferably both of them, which are included in each transistor illustrated in FIGS. 1A to 1D, are deposited by a facing target sputtering apparatus illustrated in FIG. 2, so that the influence of electric field such as plasma generated in deposition is reduced.

<Example of Structure of Deposition Apparatus>

The sputtering apparatus illustrated in FIG. 2 includes, in a vacuum case 202, a target 204a and a target 204b which are provided to face each other, magnetic field generation means 206a to 206d such as permanent magnet which generates a magnetic field in a direction perpendicular to sputtering surfaces of the targets 204a and 204b, and a substrate holder 208 over which the substrate 100 is placed. In FIG. 2, the targets are each fixed to an electrode (not shown) connected to a power source 210. The substrate holder 208 is preferably movable from left to right (or right to left) in FIG. 2 to move the substrate 100 so that the film thickness dispersion in the substrate 100 can be suppressed.

When the deposition is performed, the pressure in the vacuum case 202 is set to a reduced-pressure state or a vacuum state with the use of an exhaust unit (not shown) connected to an exhaust pipe 212, and a mixed gas of oxygen ($O_2$) and argon (Ar), or an Ar gas as a sputtering gas is introduced from a supply pipe 214 connected to a gas supply means (not shown). After that, the sputtering gas is excited by voltage application to the targets 204a and 204b, and the targets 204a and 204b are sputtered by ions that are excited. Either a DC (direct current) power source or an RF (radio frequency) power source may be used for a power source used for the sputtering. In the case where an oxide semiconductor layer is deposited, the DC power source is preferably used, and in the case where a gate insulating layer (an insulating layer) is deposited, the RF power source is preferably used.

In the sputtering method illustrated in FIG. 2, plasma is confined between the targets 204a and 204b with a magnetic field generated in the vertical direction with respect to the sputtering surface (the deposition surface of the substrate 100), so that the plasma does not react directly with the substrate 100. Thus, a deposited film and a base film thereof are not damaged by the plasma. Note that it is preferable that the deposition on the substrate 100 is stopped by a shutter 216 until the deposition speed becomes stable, and the shutter 216 is opened to start the deposition. The shape of the shutter 216 is not limited to FIG. 2.

The substrate holder 208 may be provided with a heater and the deposition may be performed while the substrate 100 is heated. With the heater of the substrate holder 208, the substrate 100 is held in the vacuum case 202 in which the reduced-pressure state is kept and a film over the substrate 100 can be heated so that the temperature of the substrate 100 is higher than or equal to 100° C. and lower than 550° C., preferably higher than or equal to 200° C. and lower than or equal to 400° C. Then, a sputtering gas (oxygen or argon) from which hydrogen, water, and the like are removed is introduced and moisture in the vacuum case 202 is removed, whereby the deposition is performed using the above targets 204a and 204b. Deposition is performed while the substrate 100 is heated with the heater of the substrate holder 208; therefore, damage due to the sputtering can be further reduced.

In order to remove moisture in the vacuum case 202, an entrapment vacuum pump is preferably used. For example, a cryopump, an ion pump, a titanium sublimation pump, or the like can be used. Alternatively, a turbo pump provided with a cold trap may be used. By exhaustion with the cryopump or the like, hydrogen, water, and the like can be removed from the vacuum case 202.

Note that although the deposition surface of the substrate 100 illustrated in FIG. 2 is parallel with the bottom surface of the vacuum case 202, it is not particularly limited. The deposition surface of the substrate 100 on the substrate holder 208 may be provided in a slanting position or in a vertical position with respect to the bottom surface of the vacuum case 202.

Figure 3A:
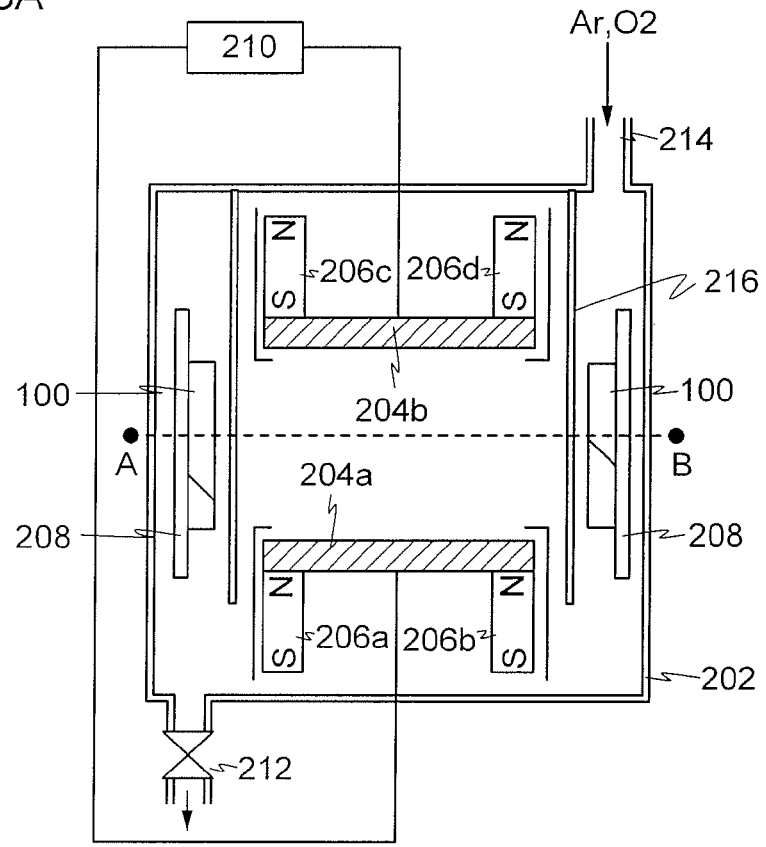
FIGS. 3A and 3B are a cross-sectional view and a top view of a deposition apparatus, respectively.
Figure 3B:
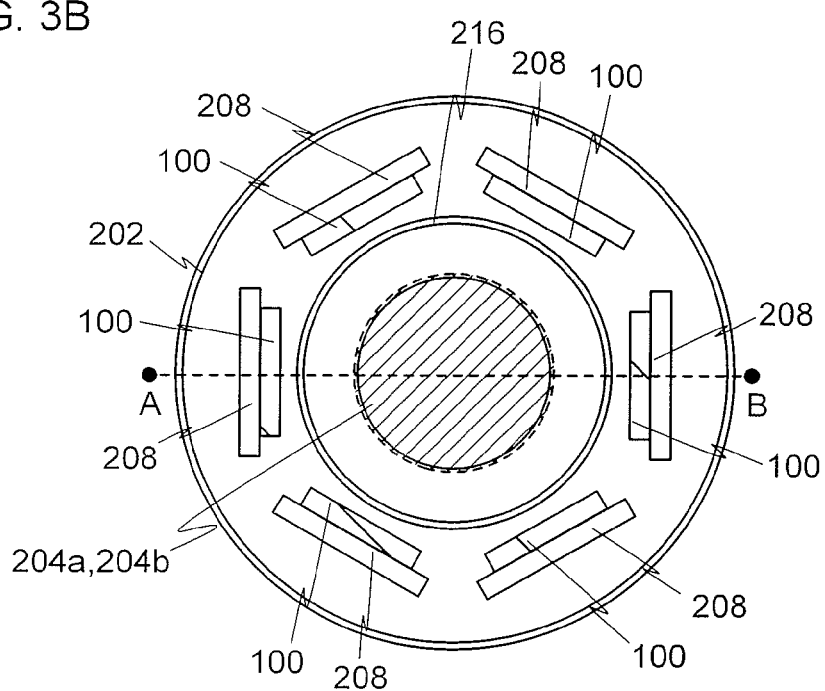

In addition, two or more substrates 100 can be provided in the vacuum case 202. For example, as illustrated in FIGS. 3A and 3B, a plurality of substrates (six substrates in FIGS. 3A and 3B) can be provided in the vacuum case 202. Note that FIG. 3A is a cross-sectional schematic view of the vacuum case 202 and FIG. 3B is a top schematic view when a cross section taken along dashed-dotted line A-B is seen from above.

In a sputtering apparatus illustrated in FIGS. 3A and 3B, the targets 204a and 204b are provided to face each other so that space is formed, and six substrates 100 are provided to form a circle so that each substrate surface is faced the space. It is preferable that the shutter 216 having a cylindrical shape is stretched from above or below the apparatus, so that the shutter 216 is closed to stop the deposition of the film on the substrate 100 until the deposition speed becomes stable, and the shutter 216 is opened to start the deposition. The shape of the shutter 216 is not limited to FIGS. 3A and 3B.

When the deposition apparatus illustrated in FIGS. 3A and 3B is used, a plurality of substrates can be processed in one sputtering process; therefore, throughput in a manufacturing process of a semiconductor device can be improved.

Note that in the transistor 180 in FIG. 1C or the transistor 190 in FIG. 1D, the insulating layer 150 is preferably deposited with the sputtering apparatus illustrated in FIG. 2 or FIGS. 3A and 3B.

<Example of Manufacturing Process of Transistor>

Hereinafter, examples of manufacturing processes of the transistors illustrated in FIGS. 1A to 1D will be described with reference to FIGS. 4A to 4C and FIGS. 5A to 5C.

<Manufacturing Process of Transistor 160>

First, an example of a manufacturing process of the transistor 160 illustrated in FIG. 1A will be described with reference to FIGS. 4A to 4C.

Figure 4A:
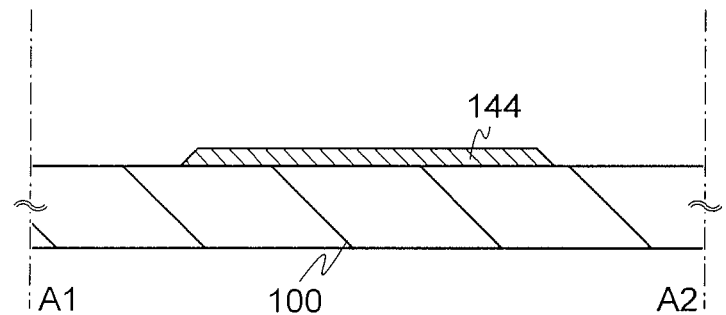
FIGS. 4A to 4C are cross-sectional views illustrating a manufacturing process of a semiconductor device.

An oxide semiconductor layer is deposited over the substrate 100 by a sputtering method, and the oxide semiconductor layer is selectively etched to form an island-shaped oxide semiconductor layer 144 (see FIG. 4A). For the deposition of the oxide semiconductor layer, the facing target sputtering method described using FIG. 2 or FIGS. 3A and 3B is preferably used. When the facing target sputtering method is used for the deposition of the oxide semiconductor layer, damage due to plasma (plasma damage) to the deposition surface and the oxide semiconductor layer which is to be formed can be suppressed; thus, the oxide semiconductor layer can have high quality.

Although there is no particular limitation on a substrate that can be used as the substrate 100, it is necessary that the substrate have heat resistance to withstand at least a heat treatment performed later. For example, a substrate such as a glass substrate, a ceramic substrate, a quartz substrate, a sapphire substrate, or the like can be used. In addition, as long as the deposition surface of the oxide semiconductor layer 144 includes an insulating surface, a single crystal semiconductor substrate or a polycrystalline semiconductor substrate made of silicon, silicon carbide, or the like, a compound semiconductor substrate made of silicon germanium or the like, or an SOI substrate can be used for example, and a semiconductor element may be provided over the substrate. Further, a base film may be provided over the substrate 100.

As the oxide semiconductor layer, any of the following oxide semiconductors can be used: an In—Sn—Ga—Zn—O-based oxide semiconductor which is a four-component metal oxide; an In—Ga—Zn—O-based oxide semiconductor, an In—Sn—Zn—O-based oxide semiconductor, an In—Al—Zn—O-based oxide semiconductor, a Sn—Ga—Zn—O-based oxide semiconductor, an Al—Ga—Zn—O-based oxide semiconductor, or a Sn—Al—Zn—O-based oxide semiconductor which are three-component metal oxides; an In—Zn—O-based oxide semiconductor, a Sn—Zn—O-based oxide semiconductor, an Al—Zn—O-based oxide semiconductor, a Zn—Mg—O-based oxide semiconductor, a Sn—Mg—O-based oxide semiconductor, or an In—Mg—O-based oxide semiconductor which are two-component metal oxides; or an In—O-based oxide semiconductor, a Sn—O-based oxide semiconductor, or a Zn—O-based oxide semiconductor.

In particular, an In—Ga—Zn—O-based oxide semiconductor material has sufficiently high resistance when there is no electric field; thus, the off-state current can be sufficiently reduced. In addition, the In—Ga—Zn—O-based oxide semiconductor material has high field-effect mobility; thus, it is suitable for a semiconductor device.

As a typical example of the In—Ga—Zn—O-based oxide semiconductor material, an oxide semiconductor material represented by $InGaO_3(ZnO)_m$ (m>0) is given. Further, there is an oxide semiconductor material represented by $InMO_3(ZnO)_m$ (m>0) when M is used instead of Ga. Here, M denotes one or more metal elements selected from gallium (Ga), aluminum (Al), iron (Fe), nickel (Ni), manganese (Mn), cobalt (Co), or the like. For example, M can be Ga, Ga and Al, Ga and Fe, Ga and Ni, Ga and Mn, Ga and Co, or the like. Note that the above-described compositions are derived from the crystal structures that the oxide semiconductor material can have and are only examples.

As a target used for forming the oxide semiconductor layer by a sputtering method, a target with a composition ratio of In:Ga:Zn=1:x:y (x is greater than or equal to 0, and y is greater than or equal to 0.5 and less than or equal to 5) is preferably used. For example, a target with a composition ratio of In:Ga:Zn=1:1:1 [atomic ratio] (x=1, y=1) (that is, $In_2O_3:Ga_2O_3$:ZnO=1:1:2 [molar ratio]) can be used. Alternatively, a target with a composition ratio of In:Ga:Zn=1:1:0.5 [atomic ratio] (x=1, y=0.5), a target with a composition ratio of In:Ga:Zn=1:1:2 [atomic ratio] (x=1, y=2), or a target with a composition ratio of In:Ga:Zn=1:0:1 [atomic ratio] (x=0, y=1) can be used.

In the case where an In—Zn—O-based material is used as an oxide semiconductor, a target thereof has a composition ratio of In:Zn=50:1 to 1:2 in an atomic ratio ($In_2O_3$:ZnO=25:1 to 1:4 in a molar ratio), preferably, In:Zn=20:1 to 1:1 in an atomic ratio ($In_2O_3$:ZnO=10:1 to 1:2 in a molar ratio), further preferably, In:Zn=15:1 to 1.5:1 in an atomic ratio ($In_2O_3$:ZnO=15:2 to 3:4 in a molar ratio). For example, in a target used for formation of an In—Zn—O-based oxide semiconductor which has an atomic ratio of In:Zn:O=X:Y:Z, the relation of Z>(1.5X+Y) is satisfied.

In this embodiment, the oxide semiconductor layer having an amorphous structure is formed by a facing target sputtering method using an In—Ga—Zn—O-based metal oxide target.

The relative density of the metal oxide in the metal oxide target is higher than or equal to 80%, preferably higher than or equal to 95%, further preferably higher than or equal to 99.9%. With the use of the metal oxide target with high relative density, the oxide semiconductor layer having a dense structure can be formed.

The atmosphere in which the oxide semiconductor layer is formed is preferably a rare gas (typically argon) atmosphere, an oxygen atmosphere, or a mixed atmosphere containing a rare gas (typically argon) and oxygen. Specifically, it is preferable to use, for example, an atmosphere of a high-purity gas from which an impurity such as hydrogen, water, a hydroxyl group, or hydride is removed so that the concentration is lower than or equal to 1 ppm (preferably the concentration is lower than or equal to 10 ppb).

When the oxide semiconductor layer is formed, an object to be treated is held in a treatment chamber that is maintained under reduced pressure and is heated so that the temperature of the object is higher than or equal to 100° C. and lower than 550° C., preferably higher than or equal to 200° C. and lower than or equal to 400° C. Alternatively, the temperature of the object in the formation of the oxide semiconductor layer may be room temperature (25° C.±10° C.). Then, a sputtering gas from which hydrogen, water, or the like is removed is introduced into the treatment chamber while moisture in the treatment chamber is removed, whereby the oxide semiconductor layer is formed using the aforementioned target. By forming the oxide semiconductor layer while heating the object, impurities in the oxide semiconductor layer can be reduced. Further, damage due to sputtering can be reduced. In order to remove moisture in the treatment chamber, an entrapment vacuum pump is preferably used. For example, a cryopump, an ion pump, a titanium sublimation pump, or the like can be used. A turbo pump provided with a cold trap may be used. By exhaustion with the cryopump or the like, hydrogen, water, and the like can be removed from the treatment chamber; therefore, the concentration of impurities in the oxide semiconductor layer can be reduced.

Note that a pulse direct-current (DC) power supply is preferably used in the formation of the oxide semiconductor layer because dust (e.g., powdery substances produced at the time of deposition) can be reduced and the film thickness can be uniform. The thickness of the oxide semiconductor layer is greater than or equal to 1 nm and less than or equal to 50 nm, preferably greater than or equal to 1 nm and less than or equal to 30 nm, further preferably greater than or equal to 1 nm and less than or equal to 10 nm. With the oxide semiconductor layer having such a thickness, a short-channel effect that occurs along with miniaturization can be suppressed. Note that the appropriate thickness differs depending on the oxide semiconductor material to be used, the intended use of the semiconductor device, or the like; therefore, the thickness may be determined in accordance with the material, the intended use, or the like.

After that, a heat treatment (first heat treatment) is preferably performed on the oxide semiconductor layer. Excessive hydrogen (including water and hydroxyl group) in the oxide semiconductor layer is removed by the first heat treatment and the structure of the oxide semiconductor is improved, so that defect levels in the energy gap of the oxide semiconductor layer can be reduced. The temperature of the first heat treatment is, for example, higher than or equal to 300° C. and lower than 550° C. or higher than or equal to 400° C. and lower than or equal to 500° C.

Note that in the case where the oxide semiconductor layer 144 is formed using the facing target sputtering apparatus, a period under a vapor phase state in the formation is longer than in the case where the oxide semiconductor layer 144 is formed using a parallel plate sputtering apparatus; therefore, in some cases, the concentration of hydrogen (including water and hydroxyl group) in the oxide semiconductor layer formed using the facing target sputtering apparatus is higher than that of the oxide semiconductor layer formed using the parallel plate sputtering apparatus. Accordingly, it is particularly effective that the first heat treatment that has effects of dehydration or dehydrogenation is performed on the oxide semiconductor layer 144 formed by the facing target sputtering method.

The heat treatment can be performed in such a way that, for example, an object to be treated is provided into an electric furnace in which a resistance heating element or the like is used, and heated under a nitrogen atmosphere at 450° C. for an hour. During the heat treatment, the oxide semiconductor layer is not exposed to the air to prevent the entry of water and hydrogen.

The heat treatment apparatus is not limited to the electric furnace and may be an apparatus for heating an object to be treated by thermal radiation or thermal conduction from a medium such as a heated gas. For example, an RTA (rapid thermal anneal) apparatus such as a GRTA (gas rapid thermal anneal) apparatus or an LRTA (lamp rapid thermal anneal) apparatus can be used. An LRTA apparatus is an apparatus for heating an object to be treated by radiation of light (an electromagnetic wave) emitted from a lamp such as a halogen lamp, a metal halide lamp, a xenon arc lamp, a carbon arc lamp, a high-pressure sodium lamp, or a high-pressure mercury lamp. A GRTA apparatus is an apparatus for performing heat treatment using a high-temperature gas. As the gas, an inert gas that does not react with an object to be treated by heat treatment, such as nitrogen or a rare gas such as argon is used.

For example, as the first heat treatment, a GRTA treatment may be performed in the following manner. An object to be treated is put in an inert gas atmosphere that has been heated, heated for several minutes, and taken out of the inert gas atmosphere. The GRTA treatment enables high-temperature heat treatment for a short time. Moreover, the GRTA treatment can be employed even when the temperature exceeds the upper temperature limit of the object. Note that the inert gas may be switched to a gas containing oxygen during the treatment. This is because defect levels in the energy gap due to oxygen deficiency can be reduced by performing the first heat treatment in an atmosphere containing oxygen.

Note that as the inert gas atmosphere, an atmosphere that contains nitrogen or a rare gas (e.g., helium, neon, or argon) as its main component and does not contain water, hydrogen, or the like is preferably used. For example, the purity of nitrogen or a rare gas such as helium, neon, or argon introduced into a heat treatment apparatus is greater than or equal to 6N (99.9999%), preferably greater than or equal to 7N (99.99999%) (that is, the concentration of the impurities is greater than or equal to 1 ppm, preferably less than or equal to 0.1 ppm).

In any case, impurities are reduced by the first heat treatment so that the i-type (intrinsic) or substantially i-type oxide semiconductor layer is obtained; thus, a transistor having excellent characteristics can be realized.

The above heat treatment (the first heat treatment) can be referred to as dehydration treatment, dehydrogenation treatment, or the like because it has an effect of removing hydrogen, water, and the like. The dehydration treatment or the dehydrogenation treatment can also be performed at the following timing: after the formation of the oxide semiconductor layer, after the formation of the gate insulating layer, after the formation of the gate electrode, or the like. The number of such dehydration treatment or dehydrogenation treatment is not limited to one, and the dehydration treatment or dehydrogenation treatment may be performed plural times.

The etching of the oxide semiconductor layer may be performed either before or after the heat treatment. From the viewpoint of miniaturization of an element, dry etching is preferably used; however, wet etching may be used. An etching gas or an etchant can be selected as appropriate depending on a material of a layer to be etched. Note that in the case where leak current in an element does not cause any problems, the oxide semiconductor layer is not necessarily processed into an island shape.

Figure 4B:
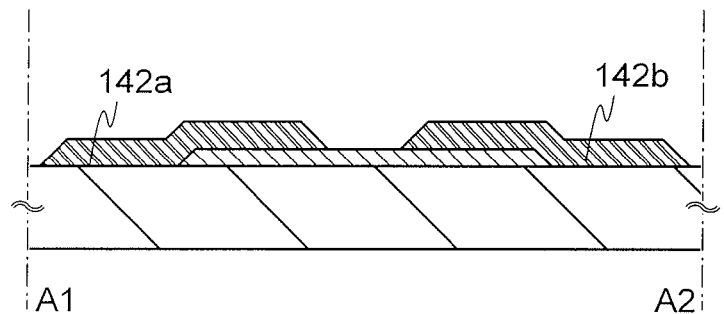

Next, a conductive layer is formed over the oxide semiconductor layer 144 and then is selectively etched, so that a source electrode 142a and a drain electrode 142b are formed (see FIG. 4B).

The conductive layer can be formed by a PVD method such as a sputtering method, or a CVD method such as a plasma CVD method. As a material for the conductive layer, an element selected from aluminum, chromium, copper, tantalum, titanium, molybdenum, and tungsten; an alloy containing any of these elements as a component; or the like can be used. Any of manganese, magnesium, zirconium, beryllium, neodymium, and scandium, or a material containing any of these in combination may be used.

The conductive layer can have a single-layer structure or a stacked-layer structure including two or more layers. For example, a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, and the like can be given. Note that in the case where the conductive layer has the single-layer structure of a titanium film or a titanium nitride film, there is an advantage that the source electrode 142a and the drain electrode 142b can be easily processed to be tapered.

Alternatively, the conductive layer may be formed using conductive metal oxide. As conductive metal oxide, indium oxide, tin oxide, zinc oxide, indium tin oxide (abbreviated to ITO in some cases), indium oxide-zinc oxide, or any of these metal oxide materials in which silicon or silicon oxide is contained can be used.

The conductive layer is preferably etched so that end portions of the source electrode 142a and the drain electrode 142b that are to be formed are tapered. Here, the taper angle is preferably greater than or equal to 30° and less than or equal to 60°, for example. The etching is performed so that the end portions of the source electrode 142a and the drain electrode 142b are tapered, whereby coverage with the gate insulating layer 146 formed later can be improved and disconnection can be prevented.

Note that the channel length (L) of the transistor 160 is determined by a distance between a lower edge portion of the source electrode 142a and a lower edge portion of the drain electrode 142b. Note that for light exposure for forming a mask used in the case where a transistor with a channel length (L) of less than 25 nm is formed, it is preferable to use extreme ultraviolet rays whose wavelength is as short as several nanometers to several tens of nanometers. In the light exposure by extreme ultraviolet light, the resolution is high and the focus depth is large. For these reasons, the channel length (L) of the transistor formed later can be greater than or equal to 10 nm and less than or equal to 1000 nm (1 μm), and the circuit can operate at higher speed. Moreover, power consumption of the semiconductor device can be reduced by miniaturization.

Figure 4C:
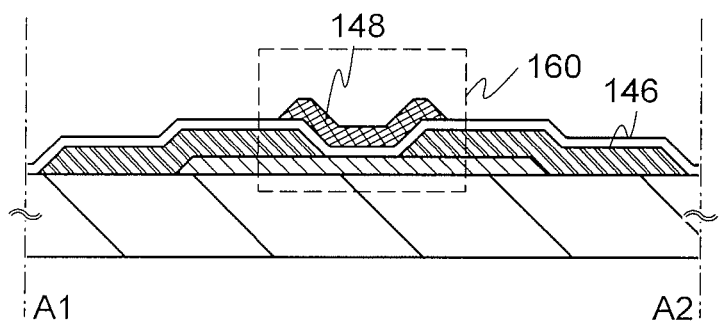

Next, over the source electrode 142a and the drain electrode 142b, the gate insulating layer 146 in contact with at least a channel formation region of the oxide semiconductor layer 144 is formed and then a gate electrode 148 is formed in a region overlapping with the oxide semiconductor layer 144 over the gate insulating layer 146 (see FIG. 4C).

The gate insulating layer 146 can be formed by a CVD method, a sputtering method, or the like. The gate insulating layer 146 is preferably formed so as to include silicon oxide, silicon nitride, silicon oxynitride, aluminum oxide, tantalum oxide, hafnium oxide, yttrium oxide, hafnium silicate (Hf-$Si_xO_y$ ($x>0$, $y>0$)), hafnium silicate ($HfSi_xO_y$ ($x>0$, $y>0$)) to which nitrogen is added, hafnium aluminate ($HfAl_xO_y$ ($x>0$, $y>0$)) to which nitrogen is added, or the like. The gate insulating layer 146 may have a single-layer structure or a stacked-layer structure. There is no particular limitation on the thickness of the gate insulating layer 146; in the case where the semiconductor device is miniaturized, the gate insulating layer 146 is preferably thin in order to secure operation of the transistor. For example, in the case of using silicon oxide, the thickness can be greater than or equal to 1 nm and less than or equal to 100 nm, preferably greater than or equal to 10 nm and less than or equal to 50 nm.

Note that for the deposition of the gate insulating layer 146, the facing target sputtering method described using FIG. 2 or FIGS. 3A and 3B is preferably used. When the facing target sputtering method is used for the deposition of the gate insulating layer 146, damage due to plasma (plasma damage) to the deposition surface (specifically, an interface between the source and drain electrodes 142a and 142b and the gate insulating layer 146, or between the oxide semiconductor layer 144 and the gate insulating layer 146) and the gate insulating layer 146 which is to be formed can be suppressed; thus, the gate insulating layer 146 having high film quality can be formed. In addition, coverage with the gate insulating layer 146 can be improved; therefore, occurrence of gate leakage current or the like can be suppressed.

When the gate insulating layer is thin as described above, a problem of gate leakage due to a tunnel effect or the like is caused. In order to resolve the problem of gate leakage, it is preferable that the gate insulating layer 146 be formed using a high dielectric constant (high-k) material such as hafnium oxide, tantalum oxide, yttrium oxide, hafnium silicate (Hf-$Si_xO_y$ ($x>0$, $y>0$)), hafnium silicate ($HfSi_xO_y$ ($x>0$, $y>0$)) to which nitrogen is added, or hafnium aluminate ($HfAl_xO_y$ ($x>0$, $y>0$)) to which nitrogen is added. By using a high-k material for the gate insulating layer 146, electrical characteristics can be ensured and the thickness can be large to prevent gate leakage. Note that a stacked-layer structure of a film including a high-k material and a film including any of silicon oxide, silicon nitride, silicon oxynitride, silicon nitride oxide, aluminum oxide, and the like may also be employed.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed under a nitrogen atmosphere at 250° C. for an hour. The second heat treatment can reduce variation in electrical characteristics of the transistor. In the case where the gate insulating layer 146 contains oxygen, oxygen is supplied to the oxide semiconductor layer 144 to compensate for oxygen deficiency of the oxide semiconductor layer 144, so that the oxide semiconductor layer can be an i-type (intrinsic) or substantially i-type oxide semiconductor layer.

Note that the second heat treatment is performed after the gate insulating layer 146 is formed in this embodiment; however, the timing of the second heat treatment is not particularly limited to this. For example, the second heat treatment may be performed after the gate electrode is formed. Alternatively, the second heat treatment may be performed following the first heat treatment, the first heat treatment may also serve as the second heat treatment, or the second heat treatment may also serve as the first heat treatment.

As described above, by performing at least one of the first heat treatment and the second heat treatment, the oxide semiconductor layer 144 can be highly purified so that impurities other than a main component of the oxide semiconductor layer 144 are contained as little as possible.

The gate electrode 148 can be formed in such a manner that a conductive layer is formed over the gate insulating layer 146 and then is etched selectively. The conductive layer to be the gate electrode 148 can be formed by a PVD method such as a sputtering method or a CVD method such as a plasma CVD method. The details are similar to those of the source electrode 142a and the drain electrode 142b or the like; thus, description thereof can be referred to.

Through the above-described steps, the transistor 160 can be formed.

A protective insulating layer or a planarization insulating layer for planarization may be provided over the transistor 160. For example, the protective insulating layer can be formed with a single-layer structure or a stacked-layer structure using one or more of a silicon oxide layer, a silicon nitride layer, a silicon oxynitride layer, a silicon nitride oxide layer, and an aluminum oxide layer. For the deposition of the protective insulating layer, the facing target sputtering method can be used.

The planarization insulating layer can be formed using a heat-resistant organic material such as polyimide, acrylic, benzocyclobutene, polyamide, or epoxy. Other than such organic materials, it is also possible to use a low-dielectric constant material (a low-k material), a siloxane-based resin, PSG (phosphosilicate glass), BPSG (borophosphosilicate glass), or the like. Note that the planarization insulating layer may be formed by stacking a plurality of insulating films formed using these materials.

Note that the transistor 170 illustrated in FIG. 1B can be manufactured by the steps similar to the steps of the transistor 160 illustrated in FIGS. 4A to 4C, except the deposition order of the source electrode 142a and the drain electrode 142b, and the oxide semiconductor layer 144. That is, over the substrate 100, the conductive layer is formed and is selectively etched, so that the source electrode 142a and the drain electrode 142b are formed and then the oxide semiconductor layer 144 is formed over the source electrode 142a and the drain electrode 142b. After that, the gate insulating layer 146 in contact with the oxide semiconductor layer 144 is formed and then the gate electrode 148 is formed in the region overlapping with the oxide semiconductor layer 144 over the gate insulating layer 146, so that the transistor 170 can be formed. After the deposition of the oxide semiconductor layer 144, the first heat treatment and the second heat treatment are preferably performed. FIGS. 4A to 4C can be referred to for the details, so that the description is omitted.

<Manufacturing Process of Transistor 180>

Next, an example of a manufacturing process of the transistor 180 illustrated in FIG. 1C will be described with reference to FIGS. 5A to 5C. Note that for components denoted with the same reference numerals as the transistor 160 illustrated in FIGS. 4A to 4C, the materials and the deposition method similar to those of the transistor 160 can be applied unless otherwise stated.

Over the substrate 100, a conductive layer is formed and is selectively etched, so that the gate electrode 148 is formed. Next, the gate insulating layer 146 is formed to cover the gate electrode 148. After that, a conductive layer is formed over the gate insulating layer 146 and is selectively etched, so that the source electrode 142a and the drain electrode 142b are formed (see FIG. 5A).

Figure 5A:
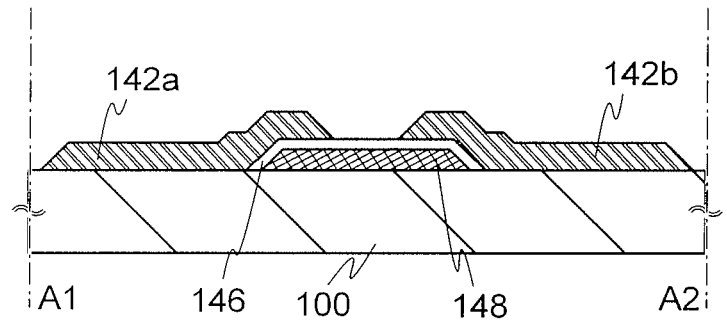
FIGS. 5A to 5C are cross-sectional views illustrating a manufacturing process of a semiconductor device.
Figure 5B:
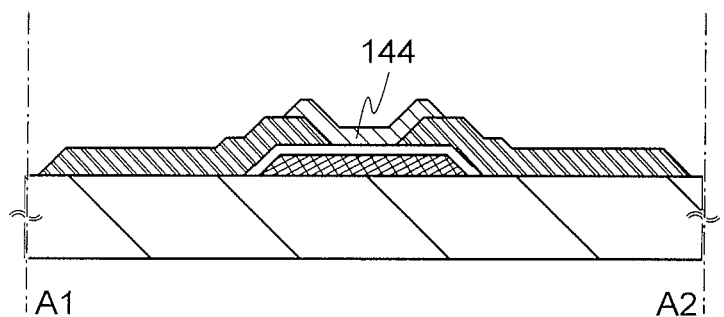
Figure 5C:
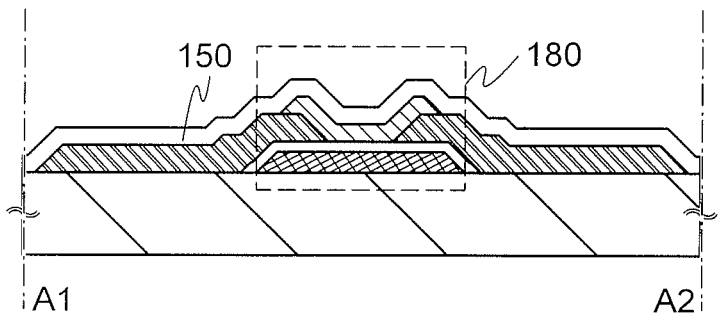

Note that the gate insulating layer 146 is selectively etched to have an island shape in FIGS. 5A to 5C; however, the gate insulating layer 146 which is not processed into an island shape can be employed. In the case where the gate insulating layer 146 is not processed into an island shape, the gate insulating layer 146 can be prevented from being contaminated due to the etching in the process.

For the deposition of the gate insulating layer 146, the facing target sputtering method described using FIG. 2 or FIGS. 3A and 3B is preferably used. When the facing target sputtering method is used for the deposition of the gate insulating layer 146, damage due to plasma (plasma damage) to the deposition surface (specifically, an interface between the gate electrode 148 and the gate insulating layer 146) and the gate insulating layer 146 which is to be formed can be suppressed; thus, the gate insulating layer 146 having high film quality can be formed. In addition, coverage with the gate insulating layer 146 can be improved; therefore, occurrence of gate leakage current or the like can be suppressed.

Next, over the source electrode 142a and the drain electrode 142b, an oxide semiconductor layer is deposited by a sputtering method and etched selectively, so that an island-shaped oxide semiconductor layer 144 is formed (see FIG. 5B). For the deposition of the oxide semiconductor layer, the facing target sputtering method described using FIG. 2 or FIGS. 3A and 3B is preferably used. When the facing target sputtering method is used for the deposition of the oxide semiconductor layer, damage due to plasma (plasma damage) to the deposition surface (specifically, an interface between the source and drain electrodes 142a and 142b and the oxide semiconductor layer, or between the gate insulating layer 146 and the oxide semiconductor layer) and the oxide semiconductor layer which is to be formed can be suppressed; thus, the oxide semiconductor layer having high film quality can be formed. In addition, coverage with the oxide semiconductor layer can be improved; therefore, occurrence of disconnection or the like can be suppressed. Further, heat treatment (first heat treatment) is preferably performed on the oxide semiconductor layer 144.

Next, an insulating layer 150 is formed so as to cover the source electrode 142a, the drain electrode 142b, and the oxide semiconductor layer 144 (see FIG. 5C).

The insulating layer 150 has a thickness of at least 1 nm and can be formed by a method by which impurities such as water and hydrogen do not enter the insulating layer 150, such as a sputtering method, as appropriate. When hydrogen is contained in the insulating layer 150, entry of the hydrogen to the oxide semiconductor layer or extraction of oxygen from the oxide semiconductor layer by the hydrogen is caused, thereby making the resistance of the back channel of the oxide semiconductor layer low (n-type), so that a parasitic channel might be formed. Therefore, it is important that a formation method in which hydrogen is not used be employed such that the insulating layer 150 contains hydrogen as little as possible.

Note that for the deposition of the insulating layer 150, the facing target sputtering method described using FIG. 2 or FIGS. 3A and 3B is preferably used. When the facing target sputtering method is used for the deposition of the insulating layer 150, damage due to plasma (plasma damage) to the deposition surface (specifically, an interface between the source and drain electrodes 142a and 142b and the insulating layer 150, or between the oxide semiconductor layer 144 and the insulating layer 150) and the insulating layer 150 which is to be formed can be suppressed; thus, the insulating layer having high film quality can be formed. In addition, coverage with the insulating layer can be improved; therefore, occurrence of disconnection or the like can be suppressed.

Next, second heat treatment is preferably performed in an inert gas atmosphere or an oxygen gas atmosphere (preferably at higher than or equal to 200° C. and lower than or equal to 400° C., for example, higher than or equal to 250° C. and lower than or equal to 350° C.). For example, the second heat treatment is performed under a nitrogen atmosphere at 250° C. for an hour. In the second heat treatment, the oxide semiconductor layer 144 is heated while being in contact with the insulating layer 150.

Through the above-described steps, after the heat treatment for dehydration or dehydrogenation is performed on the deposited oxide semiconductor layer to reduce the resistance of the oxide semiconductor layer, oxygen deficiency of the oxide semiconductor layer can be compensated. As a result, the oxide semiconductor layer 144 whose resistance is increased (the i-type oxide semiconductor layer 144) is formed. Through the above-described steps, the transistor 180 is formed.

A protective insulating layer may be formed over the insulating layer 150. As the protective insulating layer, a silicon nitride film can be formed by an RF sputtering method, for example. Alternatively, the deposition of the protective insulating layer may be performed by the facing target sputtering method. In addition, a planarization insulating layer for planarization may be provided over the protective insulating layer.

Note that the transistor 190 illustrated in FIG. 1D can be manufactured by the steps similar to the steps of the transistor 180 illustrated in FIGS. 5A to 5C, except the deposition order of the source and drain electrodes 142a and 142b and the oxide semiconductor layer 144. That is, over the substrate 100, the gate electrode 148 is formed, the gate insulating layer 146 is formed over the gate electrode 148, and the oxide semiconductor layer 144 is formed over the gate insulating layer 146. After that, the source electrode 142a and the drain electrode 142b that are in contact with the oxide semiconductor layer 144 are formed, and then, the insulating layer 150 which covers at least the channel formation region of the oxide semiconductor layer 144, the source electrode 142a, and the drain electrode 142b is formed, so that the transistor 190 can be formed. After the deposition of the oxide semiconductor layer 144, the first heat treatment and the second heat treatment are preferably performed. FIGS. 5A to 5C can be referred to for the details, so that the description is omitted.

In the transistor described in this embodiment, at least one of the gate insulating layer and the oxide semiconductor layer is formed by the facing target sputtering method, so that plasma damage to at least one of the interface between the gate insulating layer and the oxide semiconductor layer, the gate insulating layer, and the oxide semiconductor layer can be prevented; therefore, occurrence of defects such as an interface trap and an in-film trap can be suppressed. Accordingly, a transistor in which threshold voltage shift is controlled and has high reliability can be obtained.

In addition, in the transistor described in this embodiment, hydrogen that is an n-type impurity is removed from the oxide semiconductor by the first heat treatment and oxygen is introduced into the oxygen-deficient portion by the second heat treatment, so that the oxide semiconductor is highly purified such that impurities other than a main component of the oxide semiconductor are contained as little as possible and the oxide semiconductor layer is made to be an intrinsic (i-type) or substantially intrinsic oxide semiconductor. By highly purifying the oxide semiconductor film, the threshold voltage of the transistor can be positive, and a so-called normally-off transistor can be realized.

In this manner, by using an i-type or substantially i-type oxide semiconductor (for example, with a carrier concentration of less than $1 \times 10^{12}/cm^3$, preferably less than $1.45 \times 10^{10}/cm^3$), a transistor with excellent off-state current characteristics can be obtained. In addition, a transistor that has less variation in the threshold voltage and high reliability can be obtained.

In particular, in the case where the oxide semiconductor layer is formed using the facing target sputtering apparatus, in some cases, the concentration of hydrogen (including water and a hydroxyl group) in the oxide semiconductor layer is higher than that of the oxide semiconductor layer formed using the parallel plate sputtering apparatus. Accordingly, it is effective that the first heat treatment that has effects of dehydration or dehydrogenation is performed on the oxide semiconductor layer.

Further, at least one of the gate insulating layer and the oxide semiconductor layer is formed by the facing target sputtering method, so that a film with favorable coverage and stable film quality can be deposited even in the case where the gate insulating layer or the oxide semiconductor layer is thinned. Accordingly, miniaturization of a semiconductor device can be realized. When a semiconductor device is sufficiently miniaturized, the number of semiconductor devices obtained from one substrate is increased; therefore, a semiconductor device can be manufactured at low cost. Further, effects such as high-speed operation, reduction in power consumption, and the like can be obtained because of reduction in channel length.

The structures, methods, and the like described in this embodiment can be combined as appropriate with any of the structures, methods, and the like described in the other embodiments.

[Embodiment 2]

Figure 6A:
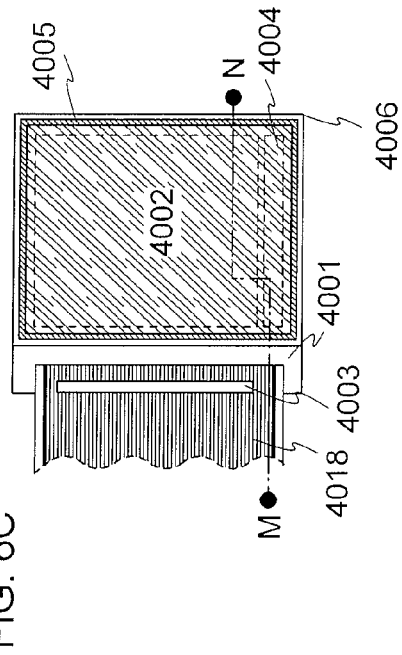
FIGS. 6A and 6C are plane views of a semiconductor device and FIG. 6B is a cross-sectional view thereof.
Figure 6C:
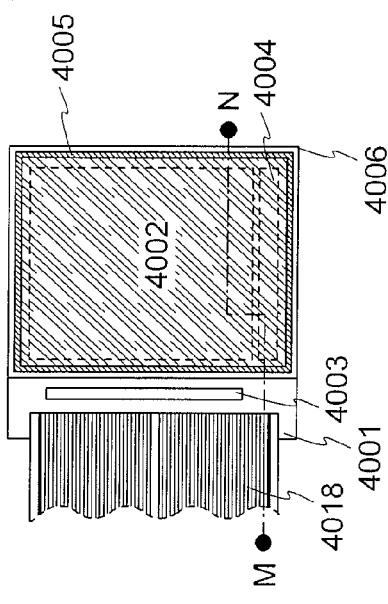
Figure 6B:
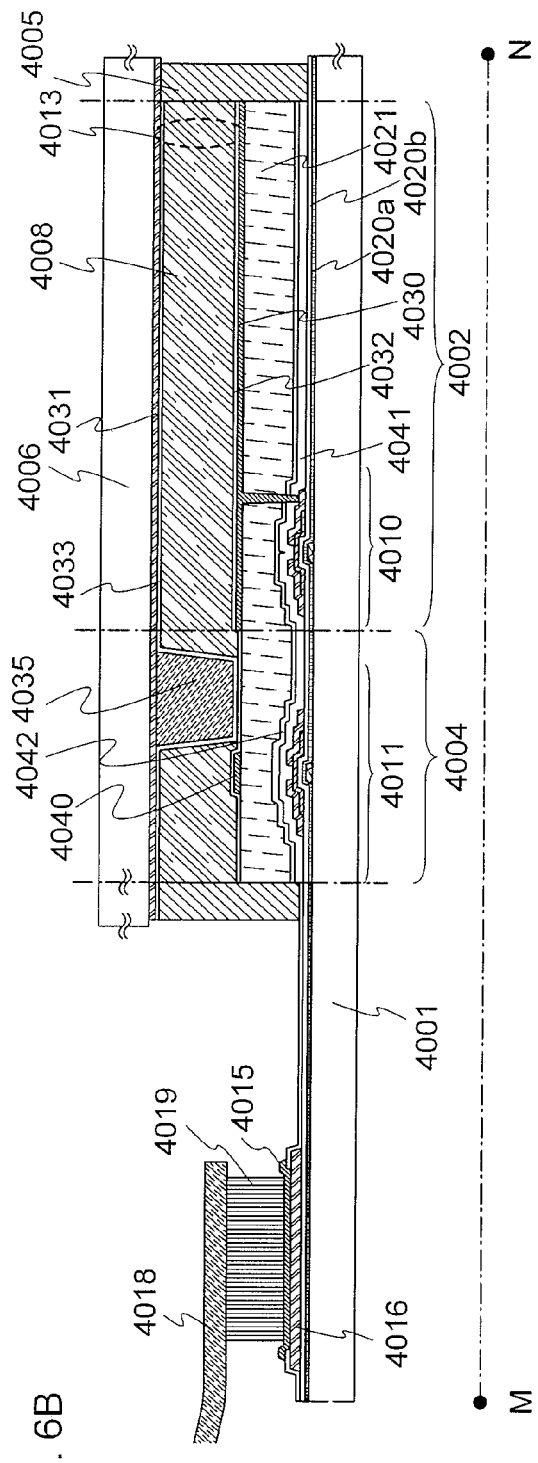

In this embodiment, an external view and a cross section of a liquid crystal display panel, which is an embodiment of a semiconductor device of the present invention, will be described with reference to FIGS. 6A to 6C. The liquid crystal display panel illustrated in FIGS. 6A to 6C includes transistors illustrated in Embodiment 1. FIGS. 6A and 6C are plan views of panels in each of which thin film transistors 4010 and 4011 and a liquid crystal element 4013 are sealed between a first substrate 4001 and a second substrate 4006 with a sealant 4005. FIG. 6B is a cross-sectional view taken along line M-N in FIG. 6A or FIG. 6C.

The sealant 4005 is provided to surround a pixel portion 4002 and a scan line driver circuit 4004 which are provided over the first substrate 4001. The second substrate 4006 is provided over the pixel portion 4002 and the scan line driver circuit 4004. Therefore, the pixel portion 4002 and the scan line driver circuit 4004 are sealed together with a liquid crystal layer 4008, by the first substrate 4001, the sealant 4005, and the second substrate 4006. A signal line driver circuit 4003 that is formed using a single crystal semiconductor film or a polycrystalline semiconductor film over a substrate separately prepared is mounted in a region that is different from the region surrounded by the sealant 4005 over the first substrate 4001.

Note that the connection method of a driver circuit which is separately formed is not particularly limited, and a COG method, a wire bonding method, a TAB method, or the like can be used. FIG. 6A illustrates an example in which the signal line driver circuit 4003 is mounted by a COG method. FIG. 6C illustrates an example in which the signal line driver circuit 4003 is mounted by a TAB method.

The pixel portion 4002 and the scan line driver circuit 4004 provided over the first substrate 4001 include a plurality of transistors. FIG. 6B illustrates the transistor 4010 included in the pixel portion 4002 and the transistor 4011 included in the scan line driver circuit 4004, as an example. In FIG. 6B, the transistors 4010 and 4011 include a first gate insulating layer 4020a and a second gate insulating layer 4020b. Note that the gate insulating layer may be a single layer. Insulating layers 4041, 4042, and 4021 are provided over the transistors 4010 and 4011.

The transistor 190 described in Embodiment 1 can be used for the transistors 4010 and 4011. Any of the transistors 160, 170, and 180 described in Embodiment 1 can be used as well.

In addition, the combination thereof can be used. In this embodiment, the transistors 4010 and 4011 are n-channel transistors.

A conductive layer 4040 is provided over part of the insulating layer 4021, which overlaps with a channel formation region of an oxide semiconductor layer in the transistor 4011 for the driver circuit. The conductive layer 4040 is provided to overlap with the channel formation region in the oxide semiconductor layer, whereby the reliability of a thin film transistor can be improved. For example, in a bias-temperature stress test (also referred to as a BT test), the amount of change in threshold voltage of the thin film transistor 4011 between before and after the BT test can be reduced. A potential of the conductive layer 4040 may be the same or different from that of a gate electrode layer of the thin film transistor 4011. The conductive layer 4040 can also function as a second gate electrode layer. Alternatively, the potential of the conductive layer 4040 may be GND or 0 V, or the conductive layer 4040 may be in a floating state.

A pixel electrode layer 4030 included in the liquid crystal element 4013 is electrically connected to the transistor 4010. A counter electrode layer 4031 of the liquid crystal element 4013 is provided over the second substrate 4006. A portion where the pixel electrode layer 4030, the counter electrode layer 4031, and the liquid crystal layer 4008 overlap with one another corresponds to the liquid crystal element 4013. Note that the pixel electrode layer 4030 and the counter electrode layer 4031 are provided with an insulating layer 4032 and an insulating layer 4033 respectively which each function as an alignment film, and the liquid crystal layer 4008 is provided between the pixel electrode layer 4030 and the counter electrode layer 4031 with the insulating layers 4032 and 4033 therebetween.

Note that as the first substrate 4001 and the second substrate 4006, a light-transmitting substrate, for example, a plastic substrate such as a polyester film or an acrylic resin film, a glass substrate, or a ceramic substrate can be used.

Reference numeral 4035 denotes a columnar spacer obtained by selectively etching an insulating film and is provided to control the distance between the pixel electrode layer 4030 and the counter electrode layer 4031 (a cell gap). Alternatively, a spherical spacer may be used. The counter electrode layer 4031 is electrically connected to a common potential line provided over the same substrate as the transistor 4010. With use of the common connection portion, the counter electrode layer 4031 and the common potential line can be electrically connected to each other through conductive particles arranged between a pair of substrates. Note that the conductive particles are included in the sealant 4005.

Alternatively, liquid crystals exhibiting a blue phase for which an alignment film is unnecessary may be used. In that case, the electrodes are arranged differently from those illustrated in FIGS. 6A to 6C because a horizontal electric field mode is employed. For example, the pixel electrode layer and the common electrode layer are arranged over the same insulating layer, and a horizontal electric field is applied to the liquid crystal layer. A blue phase is one of liquid crystal phases, which is generated just before a cholesteric phase changes into an isotropic phase while temperature of cholesteric liquid crystal is increased. Since the blue phase is generated within an only narrow range of temperature, liquid crystal composition containing a chiral agent at 5 wt % or more is used for the liquid crystal layer 4008 in order to improve the temperature range. The liquid crystal composition that includes a liquid crystal exhibiting a blue phase and a chiral agent has a short response time of 1 msec or less, has optical isotropy, which makes the alignment process unnecessary, and has a small viewing angle dependence.

Note that this embodiment can also be applied to a semi-transmissive liquid crystal display device in addition to a transmissive liquid crystal display device.

An example of the liquid crystal display device is described in which a polarizing plate is provided on the outer surface of the substrate (on the viewer side) and a coloring layer and an electrode layer used for a display element are provided on the inner surface of the substrate; however, the polarizing plate may be provided on the inner surface of the substrate. The stacked structure of the polarizing plate and the coloring layer is not limited to this embodiment and may be set as appropriate depending on materials of the polarizing plate and the coloring layer or conditions of manufacturing process. Further, a light-blocking film functioning as a black matrix may be provided in a portion other than the display portion.

Over the thin film transistors 4011 and 4010, the insulating layer 4041 is formed in contact with the oxide semiconductor layers. The insulating layer 4041 can be formed using a material and a method that are similar to those of the insulating layer 150 described in Embodiment 1. Here, as the insulating layer 4041, a silicon oxide film is formed by a sputtering method in which the film formation apparatus described in FIG. 2 or FIGS. 3A and 3B is used. A protective insulating layer 4042 is formed on and in contact with the insulating layer 4041. The protective insulating layer 4042 can be formed using a material and a method that are similar to those of the protective insulating layer described in Embodiment 1. In addition, in order to reduce the surface roughness of the thin film transistors, the protective insulating layer 4042 is covered with the insulating layer 4021 functioning as a planarization insulating film.

In addition, the insulating layer 4021 is formed as the planarization insulating film. As the insulating layer 4021, a heat-resistant organic material such as polyimide, acrylic, benzocyclobutene, polyamide, or epoxy can be used. Other than such organic materials, it is also possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using these materials.

A formation method of the insulating layer 4021 is not particularly limited, and the following method or tool can be used depending on the material: a sputtering method, an SOG method, a spin coating method, a dipping method, a spray coating method, a droplet discharge method (e.g., an ink-jet method), screen printing, offset printing, or the like), a doctor knife, a roll coater, a curtain coater, a knife coater, or the like. The baking step of the insulating layer 4021 also serves as heat treatment of the semiconductor layer, whereby a semiconductor device can be manufactured efficiently.

The pixel electrode layer 4030 and the counter electrode layer 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide, indium oxide-zinc oxide, or indium tin oxide containing silicon oxide.

Further, a variety of signals and potentials are supplied from an FPC 4018 to the signal line driver circuit 4003 that is formed separately, the scan line driver circuit 4004, or the pixel portion 4002.

A connection terminal electrode 4015 is formed using the same conductive film as the pixel electrode layer 4030 included in the liquid crystal element 4013. A terminal electrode 4016 is formed using the same conductive film as a source electrode and a drain electrode of the thin film transistors 4010 and 4011.

The connection terminal electrode 4015 is electrically connected to a terminal included in the FPC 4018 through an anisotropic conductive film 4019.

FIGS. 6A to 6C illustrate an example in which the signal line driver circuit 4003 is formed separately and mounted on the first substrate 4001; however, the present invention is not limited to this structure. The scan line driver circuit may be separately formed and then mounted, or only part of the signal line driver circuit or part of the scan line driver circuit may be separately formed and then mounted.

The liquid crystal display panel described in this embodiment includes transistors having favorable electric characteristics and high reliability described in Embodiment 1; therefore, the liquid crystal display panel having favorable quality can be provided.

The structures, methods, and the like described in this embodiment can be combined as appropriate with any of the structures, methods, and the like described in the other embodiments.

[Embodiment 3]

In this embodiment, an example of an electronic paper will be described as an embodiment of a semiconductor device.

The thin film transistor described in Embodiment 1 can be used for electronic paper in which electronic ink is driven by an element electrically connected to a switching element. The electronic paper is also referred to as an electrophoretic display device (an electrophoretic display) and is advantageous in that it has the same level of readability as plain paper, it has lower power consumption than other display devices, and it can be made thin and lightweight.

There are a variety of modes of electrophoretic displays. Electrophoretic displays contain a plurality of microcapsules dispersed in a solvent or a solute, each microcapsule containing first particles that are positively charged and second particles that are negatively charged. By applying an electric field to the microcapsules, the particles in the microcapsules move in opposite directions to each other and only the color of the particles gathering on one side is displayed. Note that the first particles and the second particles each contain pigment and do not move without an electric field. Moreover, the first particles and the second particles have different colors (which may be colorless).

Thus, an electrophoretic display is a display that utilizes a so-called dielectrophoretic effect by which a substance having a high dielectric constant moves to a high-electric field region.

A solution in which the above-described microcapsules are dispersed in a solvent is referred to as electronic ink. This electronic ink can be printed on a surface of glass, plastic, cloth, paper, or the like. In addition, by using a color filter or particles that have a pigment, color display can also be achieved.

Further, if a plurality of the above microcapsules are arranged as appropriate over an active matrix substrate so as to be interposed between two electrodes, an active matrix display device can be completed, and display can be performed by application of an electric field to the microcapsules. As the active matrix substrate, for example, the active matrix substrate obtained using the thin film transistor in Embodiment 1 can be used.

Note that the first particles and the second particles in the microcapsules may each be formed of a single material selected from a conductive material, an insulating material, a semiconductor material, a magnetic material, a liquid crystal material, a ferroelectric material, an electroluminescent material, an electrochromic material, and a magnetophoretic material, or formed of a composite material of any of these.

Figure 7:
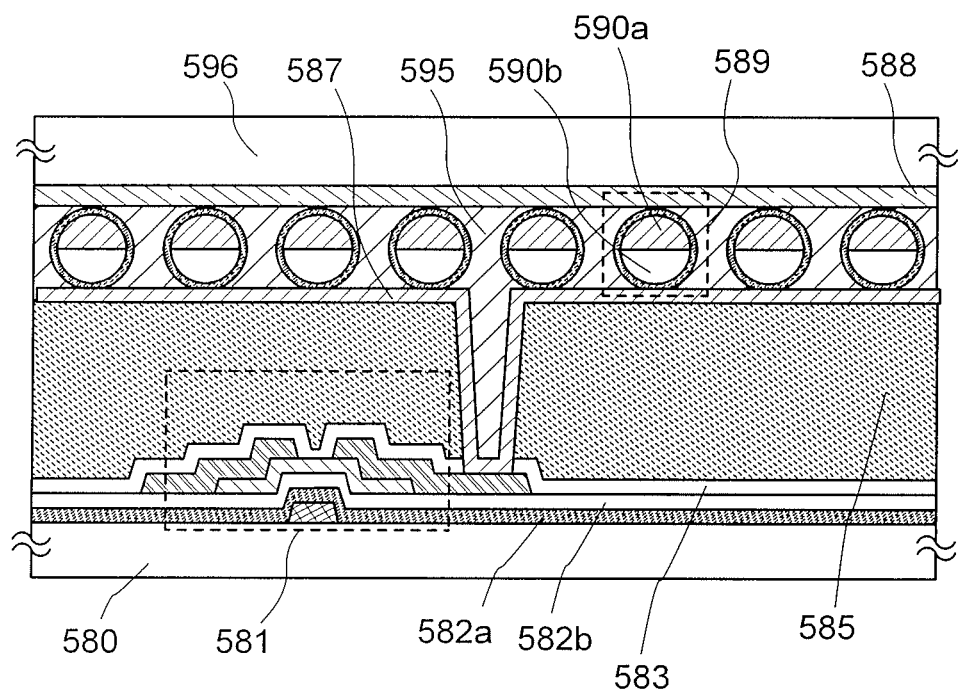
FIG. 7 is a cross-sectional view of a semiconductor device.

FIG. 7 illustrates active matrix electronic paper as an example of a semiconductor device. A transistor 581 used for the semiconductor device can be manufactured in a manner similar to that of the transistors described in Embodiment 1 and has favorable electric characteristics and high reliability.

The electronic paper in FIG. 7 is an example of a display device using a twisting ball display system. The twisting ball display system is a method in which spherical particles each colored in black and white are arranged between a first electrode layer and a second electrode layer which are electrode layers used for a display element, and a potential difference is generated between the first electrode layer and the second electrode layer to control orientation of the spherical particles, so that display is performed.

In FIG. 7, the transistor 581 is a bottom-gate transistor. The transistor 190 described in Embodiment 1 can be used for the transistor 581. Any of the transistors 160, 170, and 180 described in Embodiment 1 can be used as well. In addition, the combination thereof can be used. The transistor 581 includes an oxide semiconductor layer over and in contact with a stack of a first gate insulating layer 582a and a second gate insulating layer 582b and which is covered with an insulating layer 583 in contact with the oxide semiconductor layer. Note that the first gate insulating layer 582a is preferably formed using an insulating film containing hafnium, which is a film whose relative permittivity is higher than that of the second gate insulating layer 582b. Note that the insulating layer may be a single layer.

A source or drain electrode layer of the transistor 581 is in contact with and electrically connected to a first electrode layer 587 through an opening formed in the insulating layer 583 and an insulating layer 585. Between the first electrode layer 587 and a second electrode layer 588, spherical particles 589 each having a black region 590a, a white region 590b around which is filled with liquid, are provided between a pair of substrates 580 and 596. A space around the spherical particles 589 is filled with a filler 595 such as a resin.

In addition, the first electrode layer 587 corresponds to a pixel electrode, and the second electrode layer 588 corresponds to a common electrode. The second electrode layer 588 is electrically connected to a common potential line provided over the same substrate as the transistor 581. With the use of the common connection portion, the second electrode layer 588 and the common potential line can be electrically connected to each other through conductive particles arranged between a pair of substrates 580 and 596.

Further, instead of the twisting ball, an electrophoretic element can also be used. A microcapsule having a diameter of about 10 μm to 200 μm in which transparent liquid, positively charged white microparticles, and negatively charged black microparticles are encapsulated, is used. In the microcapsule which is provided between the first electrode layer and the second electrode layer, when an electric field is applied by the first electrode layer and the second electrode layer, the white microparticles and the black microparticles move to opposite directions to each other, so that white or black can be displayed. A display element using this principle is an electrophoretic display element and is generally called electronic paper. The electrophoretic display element has higher reflectance than a liquid crystal element; thus, an auxiliary light is unnecessary, power consumption is low, and a display portion can be recognized even in a dim place. In addition, even when power is not supplied to the display portion, an image that has been displayed once can be maintained. Accordingly, a displayed image can be stored even if a semiconductor device having a display function (which may be referred to simply as a display device or a semiconductor device provided with a display device) is distanced from an electric wave source.

Through the above steps, an electronic paper including any of the transistors described in Embodiment 1 can be manufactured. The electronic paper described in this embodiment includes the transistor having favorable electric characteristics and high reliability described in Embodiment 1; therefore, the electronic paper having favorable quality can be provided.

This embodiment can be implemented in appropriate combination with the structures described in the other embodiments.

[Embodiment 4]

In this embodiment, as an example of a semiconductor device, a memory medium (a memory element) will be described. In this embodiment, the transistor using an oxide semiconductor described in Embodiment 1 and a transistor including a material other than an oxide semiconductor are formed over one substrate.

Figure 8A:
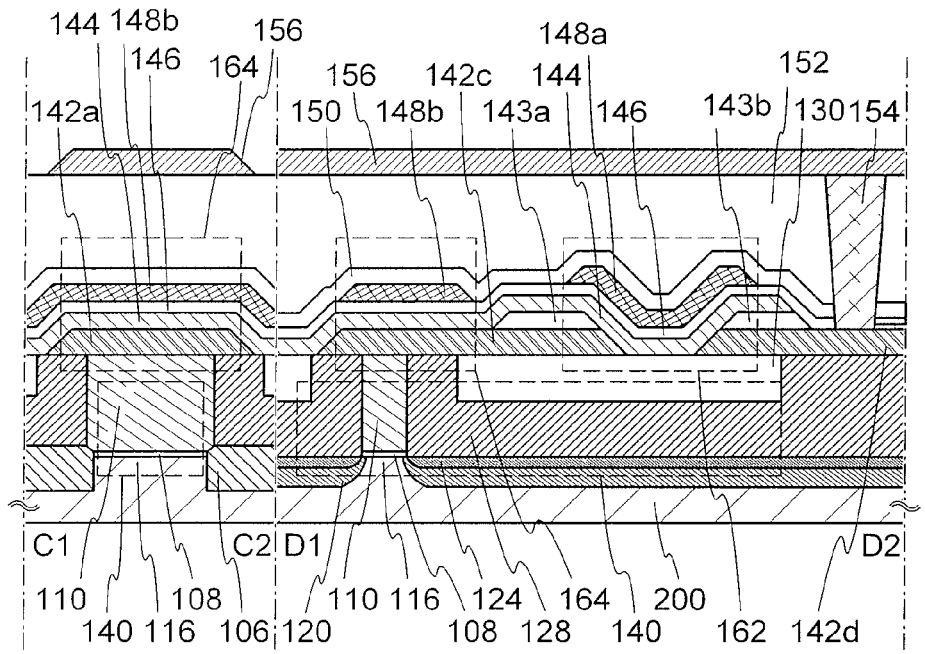
FIGS. 8A to 8C are a cross-sectional view, a top view, and a circuit diagram, of a semiconductor device, respectively.
Figure 8B:
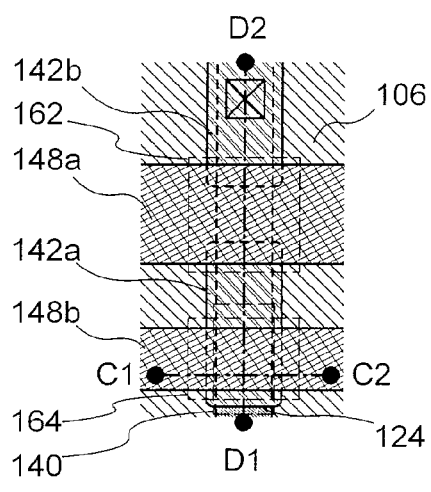
Figure 8C:
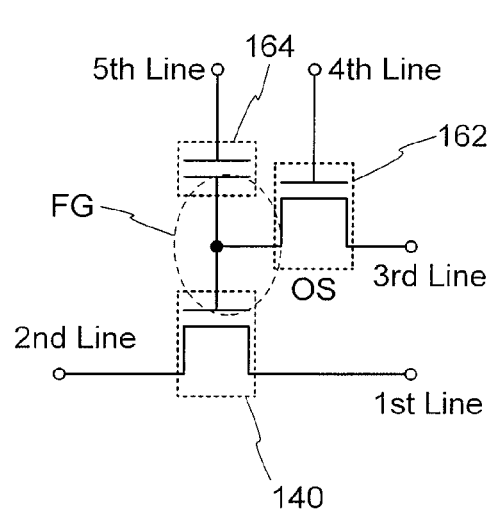

FIGS. 8A to 8C illustrate an example of a structure of a semiconductor device. FIG. 8A illustrates a cross section of the semiconductor device, and FIG. 8B illustrates a plan view of the semiconductor device. Here, FIG. 8A corresponds to a cross section along line C1-C2 and line D1-D2 in FIG. 8B. In addition, FIG. 8C illustrates an example of a diagram of a circuit using the semiconductor device as a memory element. The semiconductor device illustrated in FIGS. 8A and 8B includes a transistor 140 including a first semiconductor material in a lower portion, and a transistor 162 including a second semiconductor material in an upper portion. In this embodiment, the first semiconductor material is a semiconductor material other than an oxide semiconductor, and the second semiconductor material is an oxide semiconductor. The semiconductor material other than an oxide semiconductor can be silicon, germanium, silicon germanium, silicon carbide, gallium arsenide, or the like, and is preferably a single crystal semiconductor. Alternatively, an organic semiconductor material or the like may be used. A transistor including such a semiconductor material can easily operate at high speed. On the other hand, a transistor including an oxide semiconductor can hold charge for a long time owing to its characteristics.

The transistor 140 in FIGS. 8A to 8C includes a channel formation region 116 provided in a substrate 200 including a semiconductor material (such as silicon), impurity regions 120 provided so that the channel formation region 116 is sandwiched therebetween, metal compound regions 124 in contact with the impurity regions 120, a gate insulating layer 108 provided over the channel formation region 116, and a gate electrode 110 provided over the gate insulating layer 108.

As the substrate 200 including a semiconductor material, a single crystal semiconductor substrate or a polycrystalline semiconductor substrate made of silicon, silicon carbide, or the like; a compound semiconductor substrate made of silicon germanium or the like; an SOI substrate; or the like can be used. Note that although the term "SOI substrate" generally means a substrate in which a silicon semiconductor layer is provided on an insulating surface, the term "SOI substrate" in this specification and the like also includes a substrate in which a semiconductor layer including a material other than silicon is provided on an insulating surface. That is, a semiconductor layer included in the "SOI substrate" is not limited to a silicon semiconductor layer. Moreover, the SOI substrate can be a substrate having a structure in which a semiconductor layer is provided over an insulating substrate such as a glass substrate, with an insulating layer interposed therebetween.

An element isolation insulating layer 106 is provided over the substrate 200 so as to surround the transistor 140. An insulating layer 128 and an insulating layer 130 are provided so as to cover the transistor 140. Note that it is preferable that the transistor 140 do not have a sidewall insulating layer as illustrated in FIGS. 8A to 8C to realize high integration. On the other hand, when importance is put on the characteristics of the transistor 140, sidewall insulating layers may be provided on side surfaces of the gate electrode 110 to provide the impurity regions 120 including a region whose impurity concentrations are different may be provided.

The transistor 140 can be manufactured by a known technique. The transistor 140 manufactured in such a manner can operate at high speed. Therefore, by using the transistor as a reading transistor, data can be read at high speed.

After the transistor 140 is formed, as treatment prior to the formation of the transistor 162 and a capacitor 164, the insulating layer 128 and the insulating layer 130 are subjected to CMP treatment so that the top surfaces of the gate electrode 110 is exposed. Although, it is possible to employ etching treatment or the like other than CMP treatment as the treatment for exposing the top surfaces of the gate electrode 110, in order to improve characteristics of the transistor 162, it is preferable to planarize the surfaces of the insulating layer 128 and the insulating layer 130 as much as possible.

Next, a conductive layer is formed over the gate electrode 110, the insulating layer 128, the insulating layer 130, and the like, and etched selectively so that the source or drain electrode 142c and the source or drain electrode 142d are formed.

The conductive layer can be formed by a PVD method such as a sputtering method, or a CVD method such as a plasma CVD method. As the material of the conductive layer, an element selected from Al, Cr, Cu, Ta, Ti, Mo, and W, an alloy including any of the above element as its component, or the like can be used. Any of Mn, Mg, Zr, Be, Nd, and Sc, or a material including any of these in combination may be used.

The conductive layer can have a single-layer structure or a stacked-layer structure including two or more layers. For example, a single-layer structure of a titanium film or a titanium nitride film, a single-layer structure of an aluminum film including silicon, a two-layer structure in which a titanium film is stacked over an aluminum film, a two-layer structure in which a titanium film is stacked over a titanium nitride film, a three-layer structure in which a titanium film, an aluminum film, and a titanium film are stacked in this order, and the like can be given. Note that in the case where the conductive layer has the single-layer structure of a titanium film or a titanium nitride film, there is an advantage that the source electrode 142c and the drain electrode 142d can be easily processed to be tapered.

The channel length (L) of the transistor 162 in the upper portion is determined by a distance between a lower edge portion of the source or drain electrode 142c and a lower edge portion of the source or drain electrode 142d. When light exposure is performed to form a mask used for forming a transistor with a channel length (L) of less than 25 nm, it is preferable to use extreme ultraviolet light with a short wavelength of several nanometers to several tens of nanometers.

Next, an insulating layer 143a is formed over the source or drain electrode 142c and an insulating layer 143b is formed over the source or drain electrode 142d. The insulating layer 143a and the insulating layer 143b can be formed in such a manner that an insulating layer that covers the source or drain electrode 142c and the source or drain electrode 142d is formed and then selectively etched. Moreover, the insulating layer 143a and the insulating layer 143b are formed to overlap partly with a gate electrode that is to be formed later. By providing such an insulating layer, capacitance formed between the gate electrode and the source or drain electrode can be reduced.

The insulating layer 143a and the insulating layer 143b can be formed using a material including an inorganic insulating material such as silicon oxide, silicon oxynitride, silicon nitride, or aluminum oxide.

Although, the formation of the insulating layer 143a and the insulating layer 143b is preferable in terms of reducing the capacitance between the gate electrode and the source or drain electrode, a structure in which the insulating layers are not provided can be employed.

Next, after an oxide semiconductor layer is formed to cover the source or drain electrode 142c and the source or drain electrode 142d, the oxide semiconductor layer is selectively etched to form an oxide semiconductor layer 144.

The oxide semiconductor layer is formed using the material and formation process described in Embodiment 1. Note that for the deposition of the oxide semiconductor layer, the facing target sputtering apparatus illustrated in FIG. 2 or FIGS. 3A and 3B is preferably used.

After that, heat treatment (first heat treatment) is preferably performed on the oxide semiconductor layer. Excessive hydrogen (including water and a hydroxyl group) in the oxide semiconductor layer is removed by the first heat treatment and the structure of the oxide semiconductor layer is improved, so that defect levels in the energy gap of the oxide semiconductor layer can be reduced. The temperature of the first heat treatment is, for example, higher than or equal to 300° C. and lower than 550° C., or higher than or equal to 400° C. and lower than or equal to 500° C. In particular, in the case where the oxide semiconductor layer is formed using the facing target sputtering apparatus, in some cases, the concentration of hydrogen (including water and a hydroxyl group) in the oxide semiconductor layer is higher than that of the oxide semiconductor layer formed using a parallel plate sputtering apparatus. Accordingly, it is effective that the first heat treatment that has effects of dehydration or dehydrogenation is performed on the oxide semiconductor layer.

The heat treatment can be performed in such a way that, for example, an object to be treated is provided into an electric furnace in which a resistance heating element or the like is used, and heated under a nitrogen atmosphere at 450° C. for an hour. During the heat treatment, the oxide semiconductor layer is not exposed to the air to prevent the entry of water and hydrogen. Impurities are reduced by the first heat treatment so that the i-type (intrinsic) or substantially i-type oxide semiconductor layer is obtained. Accordingly, a transistor having excellent characteristics can be realized.

Next, the gate insulating layer 146 is formed in contact with the oxide semiconductor layer 144. The gate insulating layer 146 is formed using the material and formation process described in Embodiment 1. Note that for the deposition of the gate insulating layer 146, the facing target sputtering apparatus illustrated in FIG. 2 or FIGS. 3A and 3B is preferably used.

Next, over the gate insulating layer 146, the gate electrode 148a is formed in a region overlapping with the oxide semiconductor layer 144 and the electrode 148b is formed in a region overlapping with the source or drain electrode 142c.

After the gate insulating layer 146 is formed, second heat treatment is preferably performed in an inert gas atmosphere or an oxygen atmosphere. The temperature of the heat treatment is higher than or equal to 200° C. and lower than or equal to 450° C., preferably higher than or equal to 250° C. and lower than or equal to 350° C. For example, the heat treatment may be performed under a nitrogen atmosphere at 250° C. for an hour. The second heat treatment can reduce variation in electrical characteristics of the transistor. In the case where the gate insulating layer 146 contains oxygen, oxygen is supplied to the oxide semiconductor layer 144 to compensate for oxygen deficiency of the oxide semiconductor layer 144, so that the oxide semiconductor layer can be an i-type (intrinsic) or substantially i-type oxide semiconductor layer.

Note that the timing of the second heat treatment is not particularly limited to this. For example, the second heat treatment may be performed after the gate electrode is formed. Alternatively, the second heat treatment may be performed following the first heat treatment, the first heat treatment may also serve as the second heat treatment, or the second heat treatment may also serve as the first heat treatment.

As described above, by performing at least one of the first heat treatment and the second heat treatment, the oxide semiconductor layer 144 can be highly purified so that impurities other than a main component of the oxide semiconductor layer 144 are contained as little as possible.

The gate electrode 148a and the electrode 148b can be formed in such a manner that a conductive layer is formed over the gate insulating layer 146 and then etched selectively.

Then, the insulating layer 150 and the insulating layer 152 are formed over the gate insulating layer 146, the gate electrode 148a, and the electrode 148b. The insulating layer 150 and the insulating layer 152 can be formed by a sputtering method, a CVD method, or the like. The insulating layer 150 and the insulating layer 152 can be formed using a material including an inorganic insulating material such as silicon oxide, silicon oxynitride, silicon nitride, hafnium oxide, or aluminum oxide. Note that for the deposition of the insulating layer 150 and the insulating layer 152, the facing target sputtering apparatus illustrated in FIG. 2 or FIGS. 3A and 3B is preferably used.

Next, an opening that reaches the source or drain electrode 142d is formed in the gate insulating layer 146, the insulating layer 150, and the insulating layer 152. The opening is formed by selectively etching using a mask or the like.

Then, an electrode 154 is formed in the opening and an wiring 156 in contact with the electrode 154 is formed over the insulating layer 152.

The electrode 154 can be formed in such a manner that, for example, a conductive layer is formed by a PVD method, a CVD method, or the like in a region including the opening and then part of the conductive layer is removed by etching treatment, CMP, or the like.

The wiring 156 can be formed in such a manner that a conductive layer is formed by a PVD method typified by a sputtering method or a CVD method such as a plasma CVD method and then patterned. Further, as a material of the conductive layer, an element selected from Al, Cr, Cu, Ta, Ti, Mo, and W, an alloy including any of the above element as its component, or the like can be used. Any of Mn, Mg, Zr, Be, Nd, and Sc, or a material including any of these in combination may be used. The details are similar to those of the source or drain electrode 142c or the like.

Through the above steps, the transistor 162 and the capacitor 164 including the highly purified oxide semiconductor layer 144 is completed. The capacitor 164 includes the source or drain electrode 142c, the oxide semiconductor layer 144, the gate insulating layer 146, and the electrode 148b.

Note that in the capacitor 164 in FIGS. 8A to 8C, the oxide semiconductor layer 144 and the gate insulating layer 146 are stacked, whereby insulation between the source or drain electrode 142c and the electrode 148b can be sufficiently secured. Needless to say, the capacitor 164 without the oxide semiconductor layer 144 may be employed in order to secure sufficient capacitance. Alternatively, the capacitor 164 including an insulating layer that is formed in a manner similar to that of the insulating layer 143a may be used. Further, a structure in which the capacitor 164 is not provided may be employed.

FIG. 8C illustrates an example of the diagram of a circuit using the above semiconductor device as a memory element. In FIG. 8C, one of a source electrode and drain electrode of the transistor 162, one electrode of the capacitor 164, and a gate electrode of the transistor 140 are electrically connected to one another. A first wiring (a 1st line, also referred to as a source line) is electrically connected to a source electrode of the transistor 140. A second wiring (a 2nd line, also referred to as a bit line) is electrically connected to a drain electrode of the transistor 140. A third wiring (a 3rd Line, also referred to as a first signal line) is electrically connected to the other of the source electrode and the drain electrode of the transistor 162. A fourth wiring (a 4th Line, also referred to as a second signal line) is electrically connected to the gate electrode of the transistor 162. A fifth wiring (a 5th line, also referred to as a word line) and the other electrode of the capacitor 164 are electrically connected to each other.

The transistor 162 including an oxide semiconductor has extremely low off-state current; therefore, when the transistor 162 is in an off state, a potential of a node (hereinafter, a node FG) where the one of the source electrode and drain electrode of the transistor 162, the one electrode of the capacitor 164, and the gate electrode of the transistor 140 are electrically connected to one another can be held for an extremely long time. The capacitor 164 facilitates holding of charge given to the node FG and reading of the held data.

When data is stored in the memory cell (in writing of data), the potential of the fourth wiring is set to a potential at which the transistor 162 is turned on, whereby the transistor 162 is turned on. Thus, the potential of the third wiring is applied to the node FG and a predetermined amount of charge is accumulated in the node FG. Here, charge for applying either two different potential levels (hereinafter referred to as low-level charge and high-level charge) is given to the node FG. After that, the potential of the fourth wiring is set to a potential at which the transistor 162 is turned off, whereby the transistor 162 is turned off. This makes the node FG floating and the predetermined amount of charge is held in the node FG. The predetermined amount of charge is accumulated and held in the node FG, whereby the memory cell can store data.

Since the off-state current of the transistor 162 is extremely small, the charge applied to the node FG is held for a long period. This can remove the need of refresh operation or drastically reduce the frequency of the refresh operation, which leads to a sufficient reduction in power consumption. Moreover, stored data can be stored for a long time even when power is not supplied.

When stored data is read out (in reading of data), while a predetermined potential (a fixed potential) is applied to the first wiring, an appropriate potential (a read-out potential) is applied to the fifth wiring, whereby the transistor 140 changes its state depending on the amount of charge held in the node FG. This is because in general, when the transistor 140 is an n-channel transistor, an apparent threshold value $V_{th\_H}$ of the transistor 140 in the case where the high-level charge is held in the node FG is lower than an apparent threshold value $V_{th\_L}$ of the transistor 140 in the case where the low-level charge is held in the node FG. Here, an apparent threshold voltage refers to the potential of the fifth wiring, which is needed to turn on the transistor 140. Thus, by setting the potential of the fifth wiring to a potential $V_0$ that is between $V_{th\_H}$ and $V_{th\_L}$, charge held in the node FG can be determined. For example, in the case where the high-level electric charge is given in writing, when the potential of the fifth wiring is set to $V_0$ ($>V_{th\_H}$), the transistor 140 is turned on. In the case where the low-level electric charge is given in writing, even when the potential of the fifth wiring is set to $V_0$ ($<V_{th\_L}$), the transistor 140 remains in an off state. In such a manner, by controlling the potential of the fifth wiring and determining whether the transistor 140 is in an on state or off state (reading out the potential of the second wiring), stored data can be read out.

Further, in order to rewrite stored data, a new potential is applied to the node FG that is holding the predetermined amount of charge given in the above writing, so that the charge of the new data is held in the node FG. Specifically, the potential of the fourth wiring is set to a potential at which the transistor 162 is turned on, whereby the transistor 162 is turned on. Accordingly, the potential of the third wiring (a potential related to new data) is applied to the node FG, and the predetermined amount of charge is accumulated in the node FG. After that, the potential of the fourth wiring is set to a potential at which the transistor 162 is turned off, whereby the transistor 162 is turned off. Thus, charge of the new data is held in the node FG. In other words, while the predetermined amount of charge given in the first writing is held in the node FG, the same operation (a second writing) as in the first writing is performed, whereby the stored data can be overwritten.

In the transistor 162 described in this embodiment, at least one of the gate insulating layer and the oxide semiconductor layer is formed by a facing target sputtering method, so that plasma damage to at least one of the interface between the gate insulating layer and the oxide semiconductor layer, the gate insulating layer, and the oxide semiconductor layer can be prevented; therefore, occurrence of defects such as an interface trap and an in-film trap can be suppressed. In addition, with the use of the purified and intrinsic oxide semiconductor layer 144, the off-state current of the transistor 162 can be sufficiently reduced. Further, with the use of such a transistor, a semiconductor device capable of holding stored data for an extremely long time can be obtained.

In the semiconductor device described in this embodiment, the transistor 140 and the transistor 162 are overlapping with each other; therefore, a semiconductor device in which the degree of integration is sufficiently improved can be realized.

The structures, methods, and the like described in this embodiment can be combined as appropriate with any of the structures, methods, and the like described in the other embodiments.

[Embodiment 5]

A semiconductor device disclosed in this specification can be applied to a variety of electronic appliances (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game console, a portable information terminal, an audio reproducing device, a large-sized game machine such as a pachinko machine, and the like.

In this embodiment, examples of an electronic device on which a transistor with favorable electric characteristics and high reliability which can be obtained in any of the above embodiments is mounted will be described with reference to FIGS. 9A to 9E.

Figure 9A:
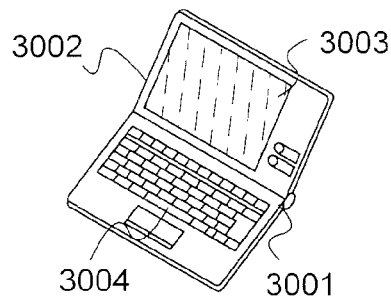
FIGS. 9A to 9E are diagrams illustrating electronic devices.

FIG. 9A is a laptop personal computer, which includes a main body 3001, a housing 3002, a display portion 3003, a keyboard 3004, and the like. Note that the laptop personal computer includes the transistor described in any of the above embodiments. Therefore, the laptop computer with favorable quality and high reliability can be realized.

Figure 9D:
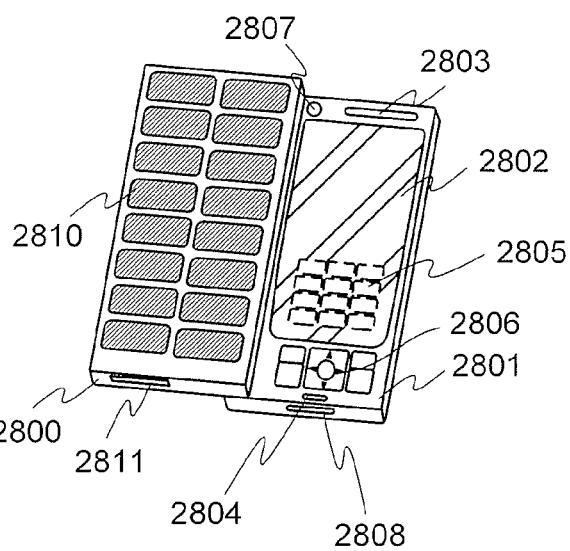
Figure 9B:
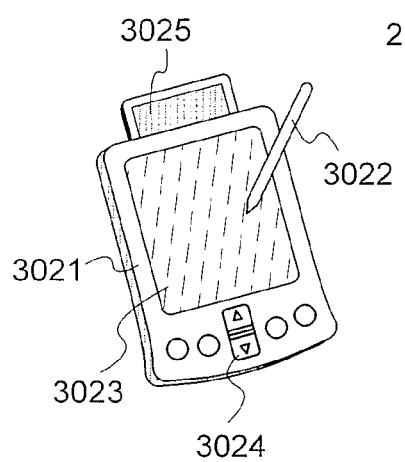

FIG. 9B is a portable information terminal (PDA), which includes a display portion 3023, an external interface 3025, an operation button 3024, and the like in a main body 3021. A stylus 3022 is included as an accessory for operation. Note that the portable information terminal (PDA) includes the transistor described in any of the above embodiments. Therefore, the portable information terminal (PDA) with favorable quality and high reliability can be realized.

Figure 9E:
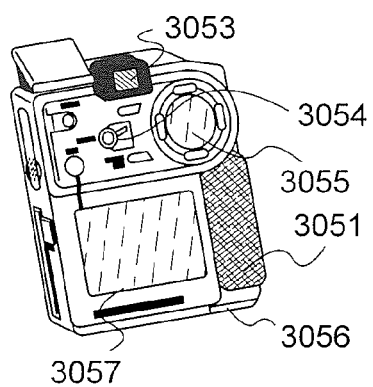
Figure 9C:
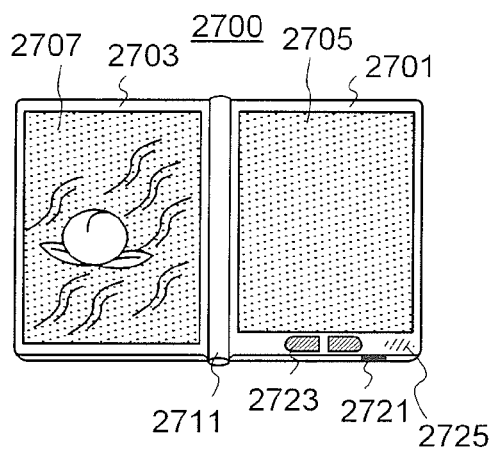

FIG. 9C is an e-book reader manufactured by mounting the electronic paper described in Embodiment 3 as a component. FIG. 9C is an example of an e-book reader. For example, an e-book reader 2700 includes two housings, a housing 2701 and a housing 2703. The housing 2701 and the housing 2703 are combined with a hinge 2711 so that the e-book reader 2700 can be opened and closed with the hinge 2711 as an axis. With such a structure, the e-book reader 2700 can operate like a paper book.

A display portion 2705 and a display portion 2707 are incorporated in the housing 2701 and the housing 2703, respectively. The display portion 2705 and the display portion 2707 may display one image or different images. In the case where the display portion 2705 and the display portion 2707 display different images, for example, a display portion on the right side (the display portion 2705 in FIG. 9C) can display text and a display portion on the left side (the display portion 2707 in FIG. 9C) can display graphics.

Further, FIG. 9C illustrates an example in which the housing 2701 is provided with an operation portion and the like. For example, the housing 2701 is provided with a power switch 2721, operation keys 2723, a speaker 2725, and the like. With the operation key 2723, pages can be turned. Note that a keyboard, a pointing device, or the like may also be provided on the surface of the housing, on which the display portion is provided. Furthermore, an external connection terminal (an earphone terminal, a USB terminal, a terminal that can be connected to various cables such as an AC adapter and a USB cable, or the like), a recording medium insertion portion, and the like may be provided on the back surface or the side surface of the housing. Moreover, the e-book reader 2700 may have a function of an electronic dictionary.

The e-book reader 2700 may have a configuration capable of wirelessly transmitting and receiving data. Through wireless communication, desired book data or the like can be purchased and downloaded from an e-book server.

FIG. 9D is a mobile phone, which includes two housings, a housing 2800 and a housing 2801. The housing 2801 includes a display panel 2802, a speaker 2803, a microphone 2804, a pointing device 2806, a camera lens 2807, an external connection terminal 2808, and the like. The housing 2801 is provided with a solar battery cell 2810 for charging of the portable information terminal, an external memory slot 2811, and the like. Further, an antenna is incorporated in the housing 2801. Note that the mobile phone includes the transistor described in any of the above embodiments at least as a component.

Further, the display panel 2802 is provided with a touch panel. A plurality of operation keys 2805 that is displayed as images is illustrated by dashed lines in FIG. 9D. Note that a boosting circuit by which a voltage output from the solar battery cell 2810 is increased to be sufficiently high for each circuit is also included.

In the display panel 2802, the display direction can be appropriately changed depending on a usage pattern. Further, the mobile phone is provided with the camera lens 2807 on the same surface as the display panel 2802; thus, it can be used as a video phone. The speaker 2803 and the microphone 2804 can be used for videophone calls, recording and playing sound, and the like as well as voice calls. Further, the housings 2800 and 2801 in a state where they are developed as illustrated in FIG. 9D can shift by sliding so that one is lapped over the other; therefore, the size of the mobile phone can be reduced, which makes the mobile phone suitable for being carried.

The external connection terminal 2808 can be connected to an AC adapter and various types of cables such as a USB cable, and charging and data communication with a personal computer are possible. Moreover, a large amount of data can be stored by inserting a storage medium into the external memory slot 2811 and can be moved. The semiconductor device described in Embodiment 4 can be used as the storage medium. According to Embodiment 4, with the use of a transistor that can reduce off-state current sufficiently, a semiconductor device capable of holding stored data for an extremely long time can be obtained.

Further, in addition to the above functions, an infrared communication function, a television reception function, or the like may be provided.

FIG. 9E is a digital camera which includes a main body 3051, a display portion (A) 3057, an eyepiece 3053, operation switches 3054, a display portion (B) 3055, a battery 3056, and the like. Note that the digital camera includes the transistor described in any of the above embodiments. Therefore, the digital camera with favorable quality and high reliability can be realized.

As described above, the electronic device described in this embodiment includes the semiconductor device according to any of the above embodiments. Therefore, display devices with favorable quality can be realized.

This application is based on Japanese Patent Application serial No. 2010-028598 filed with Japan Patent Office on Feb. 12, 2010, the entire contents of which are hereby incorporated by reference.

What is claimed is:

1. A manufacturing method of a semiconductor device, comprising the steps of:
    forming a gate electrode over a substrate;
    forming a gate insulating layer over the gate electrode; and
    forming an oxide semiconductor layer over the gate insulating layer,
    wherein the oxide semiconductor layer is formed by a sputtering method in which a pair of targets provided to face each other is used, and
    wherein a concentration of hydrogen in the oxide semiconductor layer is reduced by a first heat treatment after the oxide semiconductor layer is formed, and oxygen is supplied to the oxide semiconductor layer by a second heat treatment after the first heat treatment.

2. The manufacturing method of the semiconductor device according to claim 1, wherein the gate insulating layer is formed by a sputtering method in which a pair of targets provided to face each other is used.

3. The manufacturing method of the semiconductor device according to claim 1, wherein an insulating layer in contact with the oxide semiconductor layer is formed by a sputtering method in which a pair of targets provided to face each other is used.

4. The manufacturing method of the semiconductor device according to claim 1, wherein a carrier concentration of the oxide semiconductor layer is less than $1\times10^{12}/cm^3$.

5. A semiconductor device manufactured by using the method according to claim 1.

6. A semiconductor device according to claim 5, wherein the semiconductor device is one selected from the group consisting of a laptop computer, a portable information terminal, an e-book reader, a mobile phone and a digital camera.

7. The manufacturing method of the semiconductor device according to claim 1, further comprising a step of forming a source electrode and a drain electrode electrically connected to the oxide semiconductor layer.

8. A manufacturing method of a semiconductor device, comprising the steps of:
    forming an oxide semiconductor layer over a substrate;
    forming a gate insulating layer in contact with at least a channel formation region of the oxide semiconductor layer; and
    forming a gate electrode over the gate insulating layer,
    wherein the oxide semiconductor layer is formed by a sputtering method in which a pair of targets provided to face each other is used, and
    wherein a concentration of hydrogen in the oxide semiconductor layer is reduced by a first heat treatment after the oxide semiconductor layer is formed, and oxygen is supplied to the oxide semiconductor layer by a second heat treatment after the first heat treatment.

9. The manufacturing method of the semiconductor device according to claim 8, wherein the gate insulating layer is formed by a sputtering method in which a pair of targets provided to face each other is used.

10. The manufacturing method of the semiconductor device according to claim 8, wherein an insulating layer in contact with the oxide semiconductor layer is formed by a sputtering method in which a pair of targets provided to face each other is used.

11. The manufacturing method of the semiconductor device according to claim 8, wherein a carrier concentration of the oxide semiconductor layer is less than $1\times10^{12}/cm^3$.

12. A semiconductor device manufactured by using the method according to claim 8.

13. A semiconductor device according to claim 12, wherein the semiconductor device is one selected from the group consisting of a laptop computer, a portable information terminal, an e-book reader, a mobile phone and a digital camera.

14. The manufacturing method of the semiconductor device according to claim 8, further comprising a step of forming a source electrode and a drain electrode electrically connected to the oxide semiconductor layer.

* * * * *